(12) United States Patent
Sato

(10) Patent No.: US 8,346,187 B2
(45) Date of Patent: Jan. 1, 2013

(54) TRANSMISSION CIRCUIT AND COMMUNICATION DEVICE

(75) Inventor: Yuji Sato, Miyagi (JP)

(73) Assignee: Panasonic Corporation, Osaka (JP)

( * ) Notice: Subject to any disclaimer, the term of this patent is extended or adjusted under 35 U.S.C. 154(b) by 590 days.

(21) Appl. No.: 12/548,808

(22) Filed: Aug. 27, 2009

(65) Prior Publication Data

US 2010/0056080 A1    Mar. 4, 2010

(30) Foreign Application Priority Data

Aug. 29, 2008    (JP) ................. 2008-222358

(51) Int. Cl.
*H03C 1/52*    (2006.01)
*H04B 1/02*    (2006.01)
(52) U.S. Cl. ...................... 455/108; 455/113
(58) Field of Classification Search .................. 455/108, 455/127.1
See application file for complete search history.

(56) References Cited

U.S. PATENT DOCUMENTS

| | | | |
|---|---|---|---|
| 2003/0107433 A1 | 6/2003 | Arai et al. | |
| 2003/0137347 A1 | 7/2003 | Arai et al. | |
| 2004/0212435 A1 | 10/2004 | Arai et al. | |
| 2005/0135502 A1* | 6/2005 | Zhang et al. | 375/297 |
| 2005/0200407 A1 | 9/2005 | Arai et al. | |
| 2007/0129032 A1* | 6/2007 | Matsuura et al. | 455/127.2 |
| 2008/0261543 A1* | 10/2008 | Hara et al. | 455/113 |

FOREIGN PATENT DOCUMENTS

JP    2003-243994    8/2003

* cited by examiner

*Primary Examiner* — Duc Nguyen
*Assistant Examiner* — Fatuma Sherif
(74) *Attorney, Agent, or Firm* — Wenderoth, Lind & Ponack, L.L.P.

(57) ABSTRACT

A transmission circuit broadens a controlled bandwidth of a voltage controller while ensuring voltage withstanding ability of the voltage controller. The transmission circuit includes a phase modulator outputting a phase modulation signal and a power amplifier including a transistor. The transmission circuit also includes a collector controller controlling a collector voltage, a base controller controlling a base bias voltage, and a switching controller, which switches, when a level indicated by the power level signal is lower than a predefined value, to control the collector controller in accordance with an amplitude signal and a power level signal, and which switches, when the level indicated by the power level signal is equal to or more than the predefined value, to control the base controller in accordance with the amplitude signal and the power level signal.

10 Claims, 25 Drawing Sheets

FIG. 3

| Pout [dBm] | Vb [V] |
|---|---|
| . | . |
| . | . |
| 5 | 1.05 |
| . | . |
| 20(Ept) | 1.25 |
| . | . |
| . | . |
| . | . |

| POWER LEVEL SIGNAL | POWER LEVEL INSTRUCTION SIGNAL [V] |
|---|---|
| 1 (30dBm) | 3.0 |
| 2 (28dBm) | 2.8 |
| 3 (26dBm) | 2.6 |
| . | . |
| . | . |
| 6 (20dBm) | 2.0 (Et) |
| . | . |
| . | . |

F I G. 5
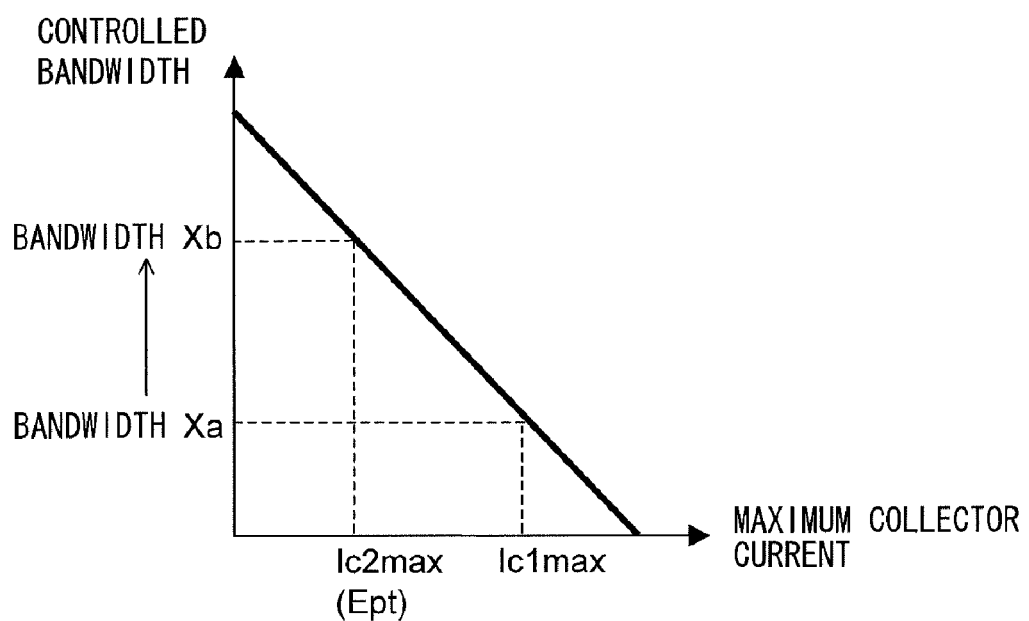

F I G. 7

| POWER LEVEL SIGNAL | POWER LEVEL INSTRUCTION SIGNAL [V] | ADJUSTED VALUE A1 (COMPARATOR OUTPUT L) | ADJUSTED VALUE A2 (COMPARATOR OUTPUT H) |
|---|---|---|---|
| 1 (30dBm) | 3.0 | 1 | 1 |
| 2 (28dBm) | 2.8 | 0.9 | 0.95 |
| 3 (26dBm) | 2.6 | 0.8 | 0.9 |
| . | . | . | . |
| . | . | . | . |
| 6 (20dBm) | 2.0 | 0.5 | 0.75 |
| . | . | . | . |
| . | . | . | . |

F I G. 8

| POWER LEVEL SIGNAL | POWER LEVEL INSTRUCTION SIGNAL [V] | POWER CONTROL VOLTAGE PV1 [V] | | POWER CONTROL VOLTAGE PV2 [V] | |
|---|---|---|---|---|---|
| | | (COMPARATOR OUTPUT L) | (COMPARATOR OUTPUT H) | (COMPARATOR OUTPUT L) | (COMPARATOR OUTPUT H) |
| 1 (30dBm) | 3.0 | 3.5 | 3.5 | 3.0 | 3.0 |
| 2 (28dBm) | 2.8 | 3.3 | 3.5 | 3.0 | 2.95 |
| 3 (26dBm) | 2.6 | 3.1 | 3.5 | 3.0 | 2.9 |
| . | . | . | . | . | . |
| . | . | . | . | . | . |
| 6 (20dBm) | 2.0 | 2.5 | 3.5 | 3.0 | 2.75 |
| . | . | . | . | . | . |
| . | . | . | . | . | . |

F I G. 1 6

| POWER LEVEL SIGNAL | POWER LEVEL INSTRUCTION SIGNAL [V] | ADJUSTED VALUE | |
|---|---|---|---|
| | | (COMPARATOR OUTPUT L) | (COMPARATOR OUTPUT H) |
| 1 (30dBm) | 3.0 | a1 | b1 |
| 2 (28dBm) | 2.8 | a2 | b2 |
| 3 (26dBm) | 2.6 | a3 | b3 |
| . | . | . | . |
| . | . | . | . |
| 6 (20dBm) | 2.0 | a6 | b6 |
| . | . | . | . |
| . | . | . | . |

FIG. 18

| POWER LEVEL SIGNAL | POWER LEVEL INSTRUCTION SIGNAL [V] | ADJUSTED VALUE A1 (COMPARATOR OUTPUT L) | | | ADJUSTED VALUE A2 (COMPARATOR OUTPUT H) | | |
|---|---|---|---|---|---|---|---|
| | | -10°C | 25°C | 60°C | -10°C | 25°C | 60°C |
| 1 (30dBm) | 3.0 | 0.9 | 1 | 1.10 | 0.9 | 1 | 1.1 |
| 2 (28dBm) | 2.8 | 0.81 | 0.9 | 0.99 | 0.86 | 0.95 | 1.05 |
| 3 (26dBm) | 2.6 | 0.72 | 0.8 | 0.88 | 0.81 | 0.9 | 0.99 |
| . | . | . | . | . | . | . | . |
| . | . | . | . | . | . | . | . |
| 6 (20dBm) | 2.0 | 0.45 | 0.5 | 0.55 | 0.68 | 0.75 | 0.83 |
| . | . | . | . | . | . | . | . |
| . | . | . | . | . | . | . | . |

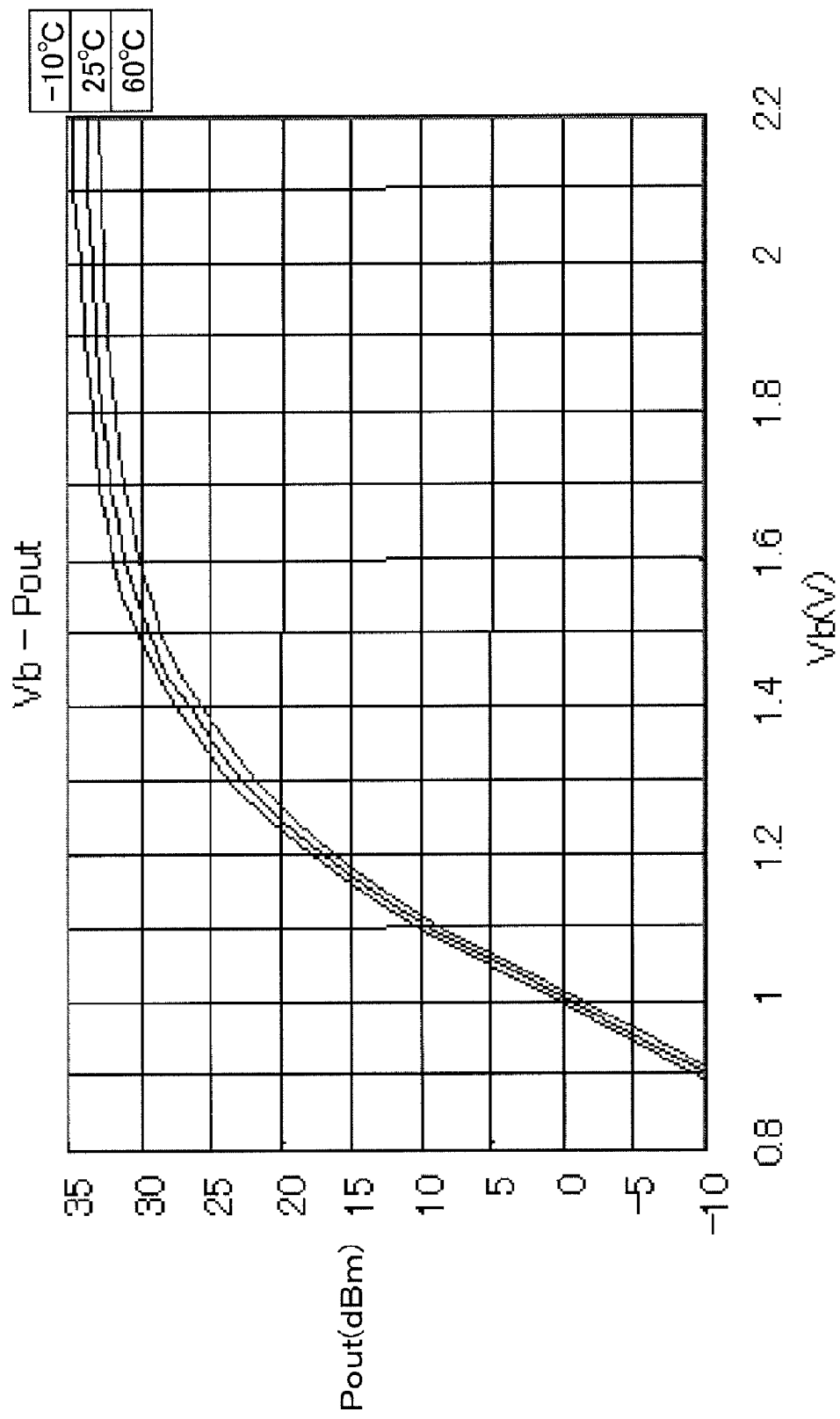
F I G. 2 2

US 8,346,187 B2

TRANSMISSION CIRCUIT AND COMMUNICATION DEVICE

BACKGROUND OF THE INVENTION

1. Field of the Invention

The present invention relates to a transmission circuit and a communication device; and more specifically relates to a transmission circuit that outputs a transmission signal that has a power level indicated by a power level signal transmitted from a predefined base station, and a communication device such as a mobile phone or the like which uses the transmission circuit.

2. Description of the Background Art

Conventionally, a transmission circuit, which includes a voltage controller that controls a voltage supplied to a power amplification transistor in a power amplifier in response to a power level signal, is suggested as a transmission circuit which is used in a communication device such as a mobile phone and the like, and which outputs a transmission signal that has a power level indicated by a power level signal transmitted from a predefined base station.

A transmission circuit 91 shown in FIG. 24 is suggested as one example of such a transmission circuit. FIG. 24 is a block diagram showing a configuration of the transmission circuit 91 which is conventional. The transmission circuit 91 is a polar modulation circuit and operates with low distortion and high efficiency. In FIG. 24, the transmission circuit 91 includes: an amplitude phase separator 911; a phase modulator 912; a collector controller 913; a power supply terminal 914; a power amplifier 915; and an output terminal 916. A power amplification transistor in the power amplifier 915 is composed of a bipolar transistor.

The amplitude phase separator 911 separates an inputted communication signal into an amplitude signal that indicates an amplitude component of the communication signal and a phase signal that indicates a phase component of the communication signal. The phase signal separated out by the amplitude phase separator 911 is inputted in the phase modulator 912, and a phase modulation is conducted on the inputted phase signal by the phase modulator 912. A phase modulation signal, which is obtained as a result of the phase modulation conducted by the phase modulator 912, is inputted into the power amplifier 915.

The amplitude signal separated out by the amplitude phase separator 911 is inputted into the collector controller 913 which is a voltage controller. A power level instruction signal is also inputted into the collector controller 913. The power level instruction signal is a signal for instructing the collector controller 913 about a power level of a transmission signal that should be outputted by the power amplifier 915; and this signal is supplied by a baseband circuit that is not diagrammatically represented. The baseband circuit generates the power level instruction signal based on the power level signal which is a signal transmitted from a predefined base station and which indicates the power level of the transmission signal that should be outputted by the power amplifier 915. The collector controller 913 controls a collector voltage Vc supplied to the power amplification transistor in the power amplifier 915 depending on the inputted amplitude signal and power level instruction signal. A DC voltage is supplied to the collector controller 913 from the power supply terminal 914.

The power amplifier 915: conducts an amplitude modulation on the phase modulation signal by amplifying the phase modulation signal by using the collector voltage Vc controlled by the collector controller 913; and matches a power level of the phase modulation signal and a power level indicated by the power level signal. The phase modulation signal, on which the amplitude modulation is conducted by the power amplifier 915, is outputted by the output terminal 916 as a transmission signal.

As described above, in the transmission circuit 91, the output power level of the power amplifier 915 is controlled by allowing the collector controller 913, which is a voltage controller, control the collector voltage Vc.

A transmission circuit 92 shown in FIG. 25 is suggested as a transmission circuit other than the transmission circuit 91 (e.g. Japanese Laid-Open Patent Publication No. 2003-243994 (hereinafter, referred to as patent document 1)). FIG. 25 is a block diagram showing a configuration of the transmission circuit 92 which is conventional. In FIG. 25, the transmission circuit 92 mainly includes: an amplitude phase separator 921; a power supply voltage controller 922; a bias voltage generator 923; a power amplifier 924; a coupler 925; a comparator 926; a switch SW1; and a switch SW2. The power amplifier 924 includes FETs for power amplification 9241 to 9243, and a bias circuit 9244.

The switch SW1 and the switch SW2 are, in response to a mode signal MODE, switched on a GSMK side when transmitting with GSMK standard, and switched on an EDGE side when transmitting with EDGE standard.

When transmission is conducted by using the GSMK standard, the power supply voltage controller 922, which is a voltage controller, controls a drain voltage Vdd1 which is supplied to the FETs for power amplification 9241 to 9243, in response to a power level instruction signal VPL. The bias voltage generator 923 generates a bias voltage Vabc based on the drain voltage Vdd1 controlled by the power supply voltage controller 922. The bias circuit 9244 supplies the gate terminals of the FETs for power amplification 9241 to 9243 with a gate bias voltage that is in accordance with the bias voltage Vabc.

When transmission is conducted by using the EDGE standard, the power supply voltage controller 922 controls the drain voltage Vdd1 which is supplied to the FETs for power amplification 9241 to 9243, in response to a signal LDO that indicates amplitude information of a communication signal from the comparator 926. The comparator 926 compares an amplitude signal Vin, which is obtained as a result of a phase amplitude isolation circuit 432 separating a communication signal into a phase signal Pin and the amplitude signal Vin, to a detection signal Vdt from the coupler 925 for power level detection provided on an output side of the power amplifier 924; and outputs a signal that is in accordance with the electrical potential difference between these signals. An output from the coupler 925 is frequency-converted by a mixer MIX, and supplied to the comparator 926 as the detection signal Vdt, via a filter FLT and an amplifier AMP.

As described above, in the transmission circuit 92, the output power level of the power amplifier 924 is controlled by allowing the power supply voltage controller 922, which is a voltage controller, to control the drain voltage Vdd1.

Required for a voltage controller of a transmission circuit used in a communication device such as a mobile phone and the like, is to further broaden a controlled bandwidth while ensuring voltage withstanding ability in order to respond to various modulation signals. However, it is difficult to further broaden a controlled bandwidth while ensuring voltage withstanding ability of the voltage controllers in the above described transmission circuit 91 and transmission circuit 92.

The reason for this will be described by using the transmission circuit 91 as an example. FIG. 26 is a figure showing a relationship between the maximum collector electric current and the controlled bandwidth, for the voltage controller in the transmission circuit 91. The maximum collector electric current shown in FIG. 26 is the maximum of a collector electric current allowed by a control transistor in the voltage controller.

The voltage controller of the transmission circuit 91 controls all bandwidths throughout the output power level of the power amplifier by only controlling the collector voltage Vc. Therefore, a variation width of a collector electric current Ic becomes, for example, a variation width shown in FIG. 26; the maximum collector electric current that should be allowed by the control transistor in the voltage controller is maximum collector electric current Ic1max; and the controlled bandwidth of the voltage controller becomes bandwidth Xa.

In order to broaden the controlled bandwidth of the voltage controller, it is necessary to reduce the size of the control transistor in the voltage controller, and subsequently reduce a parasitic capacitance of the control transistor. However, if the size of the control transistor is reduced, the maximum collector electric current allowed by the control transistor also reduces. That is, the maximum collector electric current allowed by the control transistor and the controlled bandwidth negatively correlates with each other; and a relationship between the maximum collector electric current and the controlled bandwidth becomes a relationship shown in FIG. 26.

Therefore, even if further broadening of the controlled bandwidth is attempted by expanding the controlled bandwidth of the voltage controller beyond bandwidth Xa, voltage withstanding ability of the voltage controller cannot be ensured because the maximum collector electric current allowed by the control transistor becomes smaller than the maximum collector electric current Ic1max.

SUMMARY OF THE INVENTION

Therefore, the objective of the present invention is to provide: a transmission circuit capable of further broadening a controlled bandwidth while ensuring voltage withstanding ability of a built-in voltage controller; and a communication device such as a mobile phone or the like which uses the transmission circuit.

The present invention is an invention provided for solving the above described problems; and one mode of a transmission circuit according to the present invention is a transmission circuit that outputs a transmission signal which has a power level indicated by a power level signal transmitted from a predefined base station. The transmission circuit includes: an amplitude phase separator that separates an input signal into an amplitude signal that indicates an amplitude component and a phase signal that indicates a phase component; a phase modulator that conducts a phase modulation on the phase signal and outputs a phase modulation signal; a power amplifier which includes a transistor and which amplifies the phase modulation signal by using the transistor and which outputs the resulting signal as the transmission signal; a collector controller that controls a collector voltage supplied to the transistor; a base controller that controls a base bias voltage supplied to the transistor; and a switching controller, which switches, when the power level indicated by the power level signal is lower than a predefined value, only a control of the collector controller into a control that is in accordance with the amplitude signal and the power level signal, and which switches, when the power level indicated by the power level signal is equal to or more than the predefined value, only a control of the base controller into a control that is in accordance with the amplitude signal and the power level signal; and the power amplifier amplifies the phase modulation signal based on the collector voltage and the base bias voltage controlled by the collector controller and the base controller.

Furthermore, in another mode, the switching controller preferably includes: a comparator which compares a predefined threshold value and an instruction voltage indicated by a power level instruction signal generated by having the power level signal converted by an external circuit, and which outputs a first control signal indicating that the instruction voltage is lower than the predefined threshold value, or a second control signal indicating that the instruction voltage is equal to or more than the predefined threshold value; an amplitude signal adjustor, which adjusts, when the first control signal is outputted by the comparator, a level of the amplitude signal depending on the instruction voltage and inputs the resulting signal, as a first amplitude signal, to the collector controller, and which adjusts, when the second control signal is outputted by the comparator, a level of the amplitude signal depending on the instruction voltage and inputs the resulting signal, as a second amplitude signal, to the base controller; and a power control voltage generator, which inputs, when the first control signal is outputted by the comparator, a first power control voltage that is in accordance with the instruction voltage, into the collector controller, and which inputs, when the second control signal is outputted by the comparator, a second power control voltage that is in accordance with the instruction voltage, into the base controller.

Furthermore, the power control voltage generator may further input, when the second control signal is outputted by the comparator, a third power control voltage, which is a direct current, into the collector controller; and the collector controller may have a configuration that includes a first transistor that controls a collector voltage supplied to a transistor in the power amplifier in response to the first amplitude signal and the first power control voltage, and a second transistor that controls a collector voltage supplied to a transistor in the power amplifier depending on the third power control voltage.

The transmission circuit may have a configuration that includes a threshold determiner which determines the predefined threshold value based on a power level that is obtained when a change ratio, which is the power level of the transmission signal to the base bias voltage controlled by the base controller, becomes an acceptable value.

Furthermore, in another mode, the switching controller further includes a power control voltage compensator that compensates, based on a power level of the transmission signal outputted from the power amplifier, the first power control voltage and the second power control voltage which are outputted from the power control voltage generator, such that the power level of the transmission signal outputted from the power amplifier matches the power level indicated by the power level signal. Additionally in this case, the transmission circuit may further include a temperature sensor that detects a temperature, and the amplitude signal adjustor may change a degree of adjustment level of the amplitude signal depending on the temperature detected by the temperature sensor. Alternatively, the transmission circuit may further include: a threshold determiner that determines the predefined threshold value based on a power level that is obtained when a change ratio, which is the power level of the transmission signal to the base bias voltage controlled by the base controller, becomes an acceptable value; and a temperature sensor that detects a temperature; and the threshold determiner further compensates the predefined threshold value based on the temperature detected by the temperature sensor.

Furthermore, the transmission circuit may further include at least one additional power amplifier which is provided at a stage that is antecedent of the power amplifier resulting in multiple stages of power amplifiers, and which is different from the power amplifier, and which includes a transistor, and which amplifies the phase modulation signal from the phase modulator by using the transistor and inputs the resulting signal into the power amplifier.

The present invention is also directed toward a communication device, and the communication device according to the present invention includes: a transmission circuit that outputs a transmission signal; and an antenna that outputs the transmission signal outputted from the transmission circuit; while the transmission circuit is the transmission circuit described above.

The communication device preferably further includes: a reception circuit that processes a reception signal received from the antenna; and an antenna duplexer which outputs the transmission signal outputted from the transmission circuit to the antenna, and which outputs the reception signal received from the antenna to the reception circuit.

According to the present invention, since the control of the collector voltage in accordance with the amplitude signal and the power level signal is conducted during low power operation, the size of the control transistor in the collector controller can be reduced while ensuring voltage-withstanding ability thereof. Furthermore, since a base electric current of the transistor in the power amplifier is small even during high power operation, the size of the control transistor in the base controller can be reduced while ensuring voltage-withstanding ability thereof. As described above, since sizes of the control transistors in the base controller and in the collector controller can be reduced while ensuring voltage withstanding ability of those at all power bandwidths, a controlled bandwidth can be further broadened. Furthermore, a transmission circuit capable of further broadening a controlled bandwidth while ensuring voltage withstanding ability of a built-in voltage controller; and a communication device such as a mobile phone or the like which uses the transmission circuit, can be provided.

These and other objectives, features, aspects and advantages of the present invention will become more apparent from the following detailed description of the present invention when taken in conjunction with the accompanying drawings.

BRIEF DESCRIPTION OF THE DRAWINGS

FIG. 3 shows contents stored in a LUT 13;

FIG. 5 is a schematic view showing bandwidth Xa and bandwidth Xb;

FIG. 7 shows contents stored in a LUT 1413;

FIG. 8 shows contents stored in a LUT 1416;

FIG. 12 is a block diagram showing a configuration example of a transmission circuit 1a;

FIG. 13 is a block diagram showing another configuration example of the transmission circuit 1a;

FIG. 14 is a block diagram showing another configuration example of the transmission circuit 1a;

FIG. 16 shows contents stored in a LUT 225;

FIG. 18 shows contents stored in a LUT 2211;

FIG. 22 shows the Vb-Pout characteristics at various temperatures;

DESCRIPTION OF THE PREFERRED EMBODIMENTS

Figure 1:
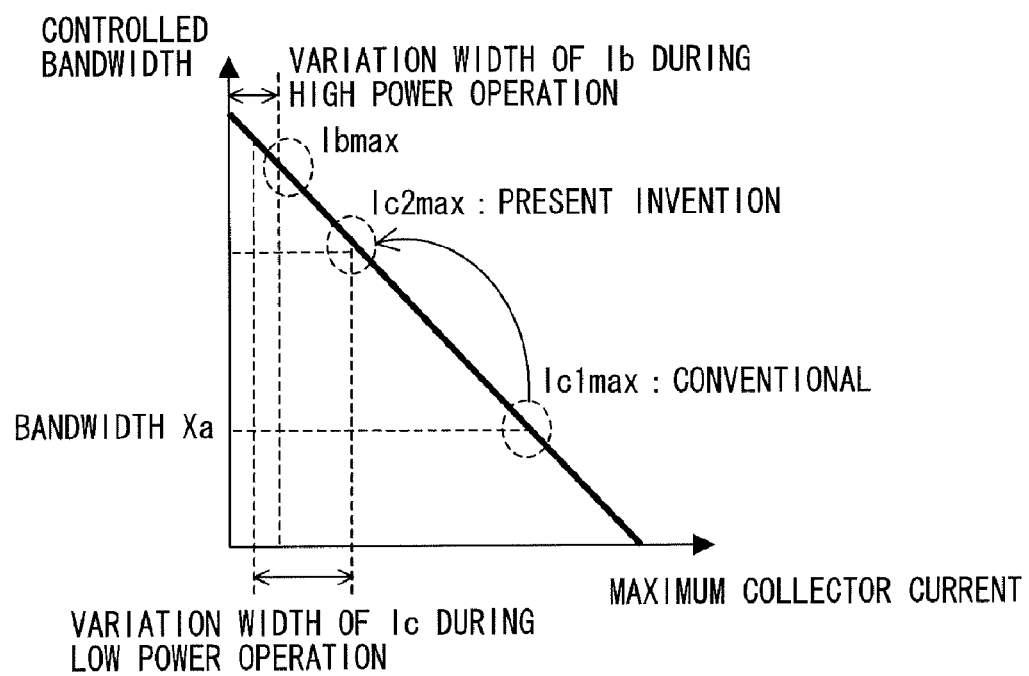
FIG. 1 shows a relationship between a maximum collector electric current and a controlled bandwidth.

Prior to describing embodiments according to the present invention, the concept regarding the present invention is described with reference to FIG. 1. FIG. 1 shows a relationship between a maximum collector electric current and a controlled bandwidth.

As shown in FIG. 1, when a voltage controller in a conventional transmission circuit described above is used, it has been difficult to expand a controlled bandwidth beyond bandwidth Xa and further broaden the controlled bandwidth while ensuring voltage withstanding ability of the voltage controller.

On the other hand, a voltage controller according to the present invention: controls a collector voltage supplied to a power amplification transistor in a power amplifier when an output power level of the power amplifier is low (during low power operation); and controls a base bias voltage supplied to the power amplification transistor in the power amplifier when the output power level of the power amplifier is high (during high power operation). Since the control of the collector voltage is conducted during low power operation as described here, a variation width of a collector electric current Ic becomes narrow, and a maximum collector electric current Ic2max becomes smaller than a maximum collector electric current Ic1max, as shown in FIG. 1. Therefore, a size of the control transistor in the voltage controller can be reduced while ensuring voltage-withstanding ability thereof.

Furthermore, a base electric current Ib which is supplied to the power amplification transistor in the power amplifier is sufficiently smaller than the collector electric current Ic, and a base electric current Ibmax is low even during high power operation, as shown in FIG. 1. Therefore, even if controlling of the base bias voltage is conducted during high power operation, the size of the control transistor in the voltage controller can be reduced while ensuring voltage-withstanding ability thereof.

As described above, in the present invention, the voltage controller: controls the collector voltage when the output power level of the power amplifier is low (during low power operation); and controls the base bias voltage when the output power level of the power amplifier is high (during high power operation). As a result, since the size of the control transistor in the voltage controller can be reduced while ensuring voltage-withstanding ability of the voltage controller, it is possible to expand the controlled bandwidth beyond bandwidth Xa and further broaden the controlled bandwidth. Described in the following are embodiments that realize such concept of the present invention.

First Embodiment

Figure 2:
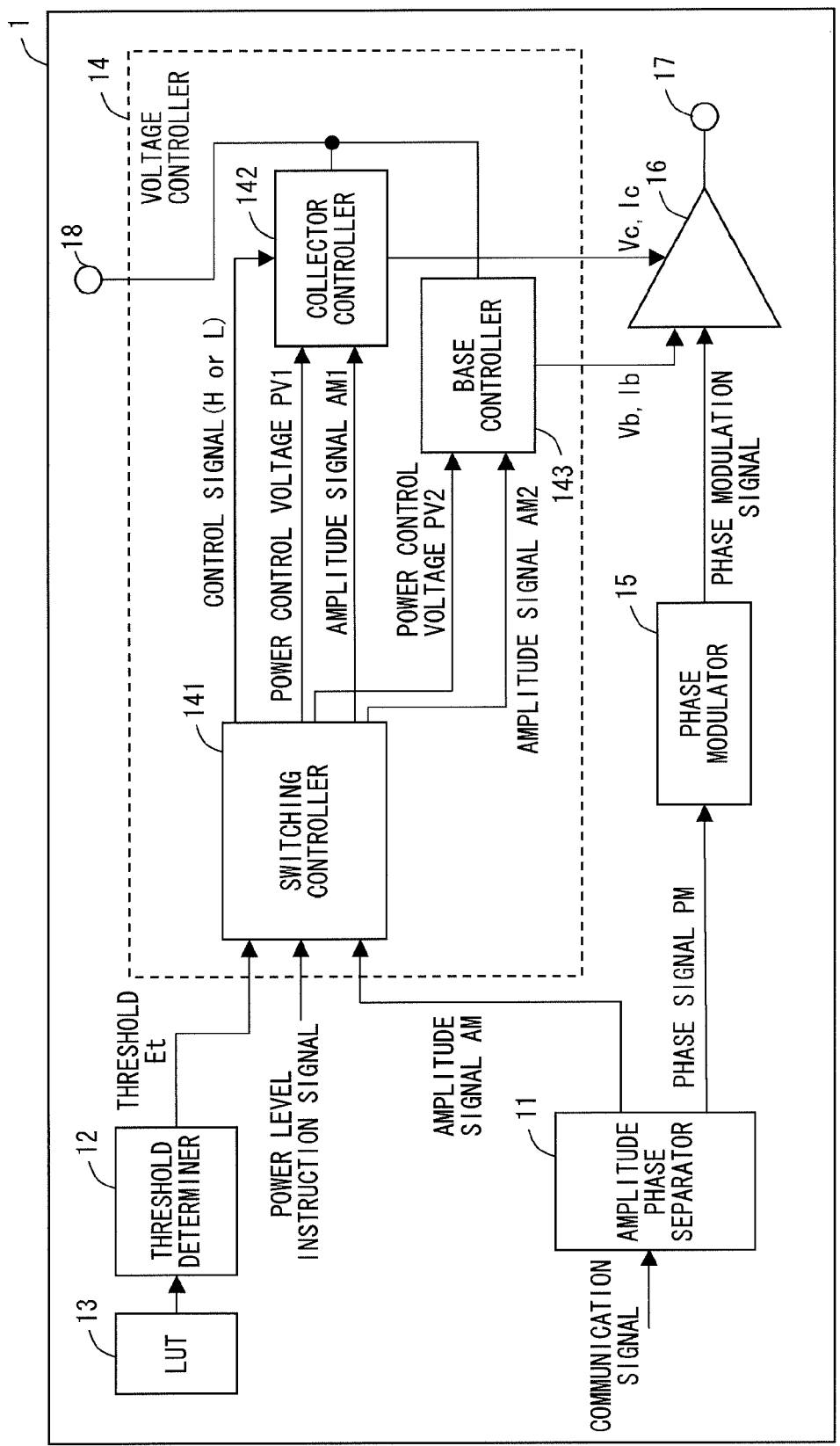
FIG. 2 is a block diagram showing a configuration example of a transmission circuit 1 according to a first embodiment.

A configuration of a transmission circuit 1 according to a first embodiment of the present invention will be describe in the following with reference to FIG. 2. FIG. 2 is a block diagram showing a configuration example of the transmission circuit 1 according to the first embodiment. The transmission circuit 1 is a polar modulation circuit and operates with low distortion and high efficiency. In FIG. 2, the transmission circuit 1 includes: an amplitude phase separator 11; a threshold determiner 12; a look-up table (LUT) 13; a voltage controller 14; a phase modulator 15; a power amplifier 16; an output terminal 17; and a power supply terminal 18. A power amplification transistor in the power amplifier 16 is composed of a bipolar transistor.

The amplitude phase separator 11 separates an inputted communication signal into an amplitude signal AM that indicates an amplitude component of the communication signal and a phase signal PM that indicates a phase component of the communication signal. The amplitude signal AM is inputted into the voltage controller 14; and the phase signal PM is inputted into the phase modulator 15.

The threshold determiner 12 references, for example, in response to a threshold determination order, the LUT 13 which has been configured with each of the characteristics shown in FIG. 3, and determines a threshold Et of an instruction voltage indicated by a power level instruction signal. FIG. 3 shows the contents stored in the LUT 13. As shown in FIG. 3, the LUT 13 stores: base bias voltage (Vb)—power amplifier 16 output power level (Pout) characteristics; and power level signal—power level instruction signal characteristics. A determination method of the threshold Et will be described in the following.

Figure 4:
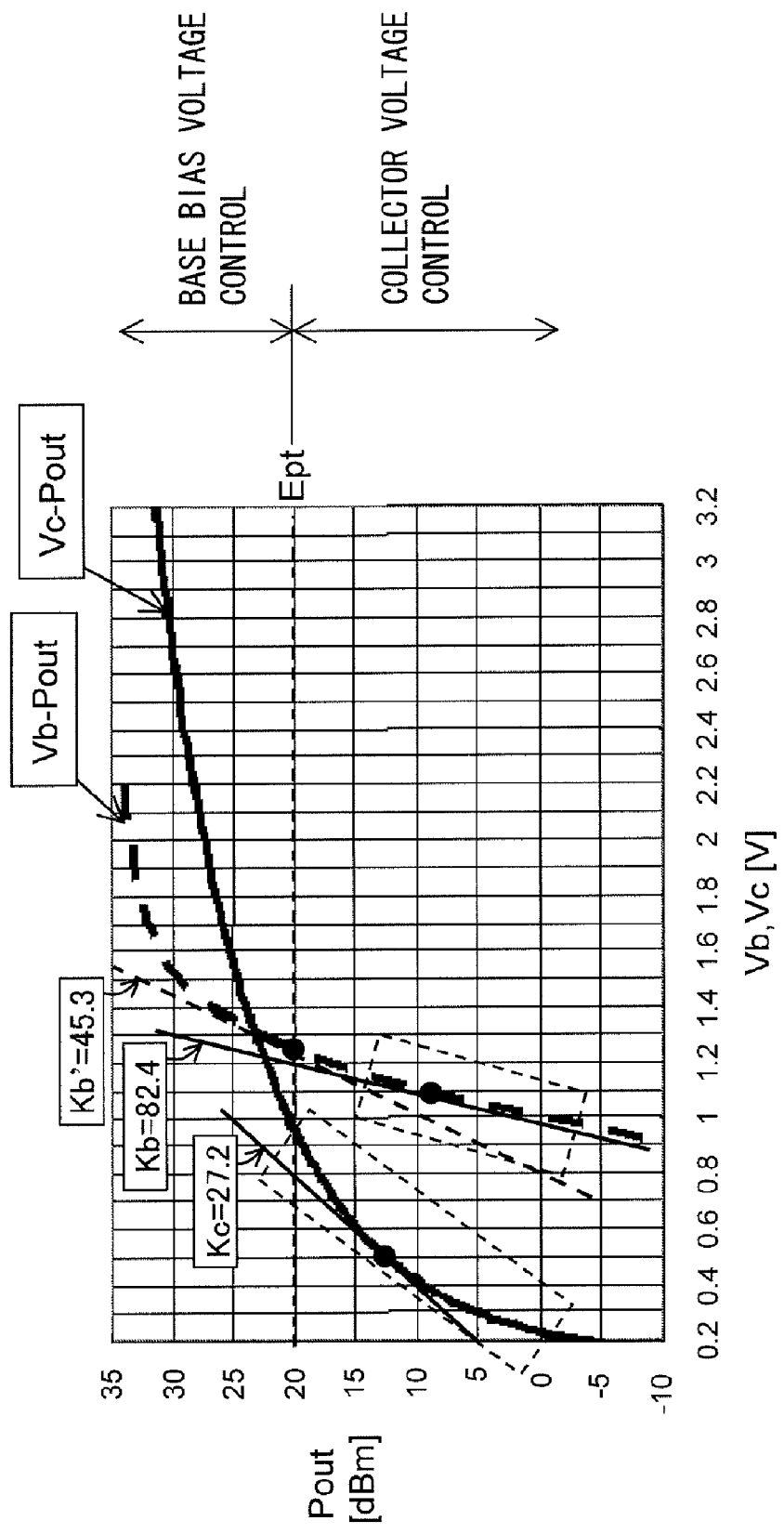
FIG. 4 shows an overlay of Vb-Pout characteristics and Vc-Pout characteristics.

First, the threshold determiner 12 references, for example, in response to the threshold determination order, the Vb-Pout characteristics of the LUT 13, and determines Pout, obtained when the control sensitivity of Vb becomes an acceptable value, as Pout threshold Ept. A determination method of Pout threshold Ept will be described in detail in the following with reference to FIG. 4. FIG. 4 shows an overlay of the Vb-Pout characteristics and collector voltage (Vc)-Pout characteristics (Vc-Pout characteristics).

As shown in the example in FIG. 4, when a collector voltage control is conducted, the change ratio of Pout to Vc (control sensitivity of Vc) reduces as Vc increases, and tends to saturate when Vc exceeds 1.0 V. When the change ratio of Pout to Vc within a range enclosed by a broken line in FIG. 4 ($0.2 \leq Vc \leq 1.0$) is obtained by using Vc=0.5 V, the result is inclination of Kc=27.2 (dBm/V). Furthermore, as shown in the example in FIG. 4, when a base bias voltage control is conducted, the change ratio of Pout to Vb (control sensitivity of Vb) reduces as Vb increases, and tends to saturate when Vb exceeds 1.4 V. When the change ratio of Pout to Vb within a range enclosed by a broken line in FIG. 4 ($0.95 \leq Vb \leq 1.15$) is obtained by using Vb=1.1V, the result is inclination of Kb=82.4 (dBm/V). Here, change ratios Kc and Kb of Pout to Vc and Vb can be respectively obtained as derivatives of Pout to Vc and Vb.

It can be understood from the description above that, the control sensitivity of Vb is approximately three times larger than the control sensitivity of Vc when Pout is smaller than 20 dBm, and controlling of Pout can be conducted easier with the collector voltage control.

However, as describe previously, since the collector voltage control has a limitation in the controlled bandwidth of Pout, a sufficient voltage withstand ability cannot be ensured. Therefore, in the current embodiment, a configuration of Vb=1.25 V and inclination of Kb'=45.3 (dBm/V) is applied, which allows reduction of inclination Kb for approximately 55% when Vb=1.1V. This configuration is obtained a result of: focusing attention on the fact that the change ratio of Pout to Vb reduces as Vb increases even in a case with the base bias voltage control; and investigating inclination of Kb as the control sensitivity of Vb. When Vb exceeds 1.25 V, the change ratio of Pout to Vb linearly reduces; and when Vb exceeds 1.4 V, the change ratio tends to saturate.

Therefore, by having the threshold determiner 12 determine Pout=20 dBm at Vb=1.25 V as Ept: at a range that is equal to or lower than Ept, Pout is easily controlled by conducting the collector voltage control which has a control sensitivity lower than the base bias voltage control; and at a range that exceeds Ept, control range of Pout can be broadened by conducting the base bias voltage control that is configured at a range in which the control sensitivity is easily controlled. Here, as shown in FIG. 5, the controlled bandwidth that is determined by Vc at Ept becomes bandwidth Xb. FIG. 5 is a schematic view showing bandwidth Xa and bandwidth Xb.

In the current embodiment, although Ept=20 dBm is determined as a result of determining inclination Kb'=45.3 (dBm/V) as an acceptable value of the control sensitivity of Vb; the value of Ept may be determined depending on another acceptable value of the control sensitivity of Vb.

Furthermore, the change ratio (i.e. derivative) Kb of Pout to Vb obtained when the base bias voltage control is conducted, may be stored in the LUT 13 in advance, and the transmission circuit 1 may determine the threshold Et based on the magnitude of the stored derivative Kb. More specifically, for example, the transmission circuit 1 may be configured with a Vb by using an arbitrarily sweep width of about 0.01 V to 0.05 V, and a derivative Kb that corresponds to the Vb may be store in the LUT 13 in advance. In one example of an operation having the above configuration, the threshold determiner 12 refers the LUT 13, and determines Pout threshold Ept based on a Vb obtained when the magnitude of the derivative Kb becomes equal to or less than a predefined value B1. The threshold determiner 12 can determine the threshold Et based on the determined Pout threshold Ept.

Moreover, the change ratios (i.e. derivative) Kc and Kb of Pout to Vc and Vb which are obtained when the collector voltage control and the base bias voltage control are conducted, may be stored in the LUT 13 in advance, and the transmission circuit 1 may determine the threshold Et based on a comparison of the store derivatives Kc and Kb. In one example of an operation having the above configuration, the threshold determiner 12 refers the LUT 13, and determines Pout threshold Ept based on a Vb obtained when the ratio of Kb to Kc (i.e. Kb/Kc) becomes equal to or less than a predefined value B2. The threshold determiner 12 can determine the threshold Et based on the determined Pout threshold Ept.

Next, the threshold determiner 12, after referring to the power level signal—power level instruction signal characteristics in the LUT 13, determines an instruction voltage, which is indicated by an power level instruction signal and which is obtained when Pout threshold Ept is 20 dBm, as the threshold Et. The power level signal corresponds to Pout; and here, as one example, the instruction voltage (threshold Et) of the power level instruction signal when Pout is 20 dBm is defined as 2.0 V.

The transmission circuit 1 does not necessary have to include the threshold determiner 12 and the LUT 13 described above, and instead, may be configured in advance with a threshold Et determined by using the above described method. In this case, the threshold Et configured in advance is inputted into the voltage controller 14.

The voltage controller 14: is inputted with the amplitude signal AM, the power level instruction signal, and the threshold Et; and controls a voltage supplied to the power amplification transistor in the power amplifier 16 depending on the power level instruction signal and the amplitude signal AM. The voltage controller 14 includes: a switching controller 141; a collector controller 142; and a base controller 143. The power level instruction signal is a signal for instructing the voltage controller 14 about a transmission signal power level that should be outputted by the power amplifier 16; and this signal is supplied by a baseband circuit that is not diagrammatically represented. The baseband circuit generates the power level instruction signal based on the power level signal which is a signal transmitted from a predefined base station and which indicates the transmission signal power level that should be outputted by the power amplifier 16.

The amplitude signal AM, the power level instruction signal, and the threshold Et, are inputted into the switching controller 141. The switching controller 141 switches controls of the collector controller 142 and the base controller 143, based on the power level instruction signal and the threshold Et.

Figure 6:
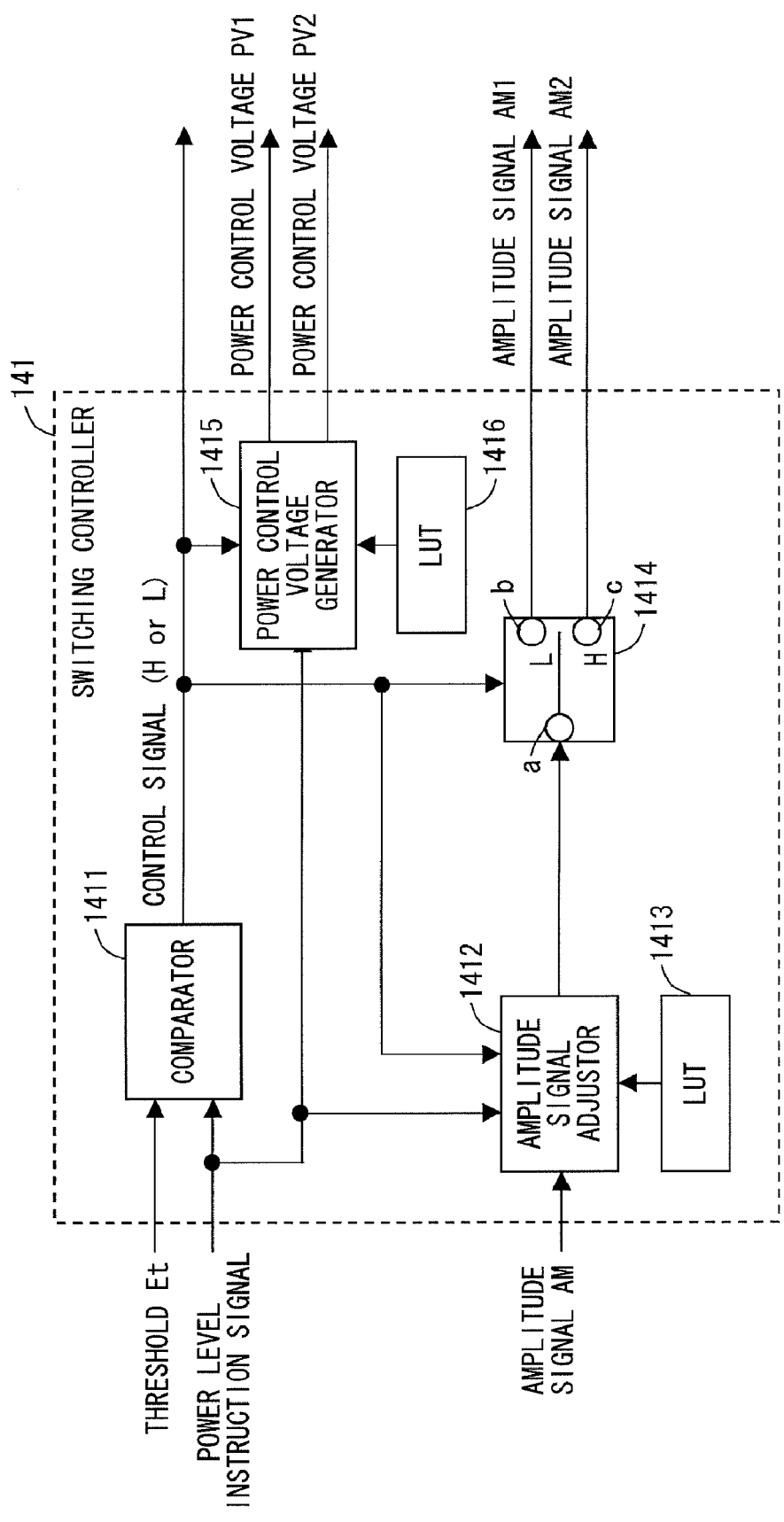
FIG. 6 is a block diagram showing a configuration example of a switching controller 141.

A configuration of the switching controller 141 will be described in detail in the following with reference to FIG. 6. FIG. 6 is a block diagram showing a configuration example of the switching controller 141. As shown in FIG. 6, the switching controller 141 includes: a comparator 1411; an amplitude signal adjustor 1412; a LUT 1413; a switch 1414; a power control voltage generator 1415; and a LUT 1416.

The power level instruction signal and the threshold Et are inputted into the comparator 1411. The comparator 1411, compares the instruction voltage indicated by the power level instruction signal and the threshold Et; and when the instruction voltage is lower than the threshold Et, outputs a control signal (L) that indicates this comparison result; or alternatively when the instruction voltage is equal to or larger than the threshold Et, outputs a control signal (H) that indicates this alternative comparison result.

The amplitude signal AM, the power level instruction signal, and the control signal are inputted into the amplitude signal adjustor 1412. When the control signal is L, the amplitude signal adjustor 1412 reads out an adjusted value A1 that corresponds to the instruction voltage indicated by the power level instruction signal, from the LUT 1413 which has been configured with adjusted values A1 and A2 as shown in FIG. 7. FIG. 7 shows contents stored in the LUT 1413. Next, the amplitude signal adjustor 1412 adjusts the level of the amplitude signal AM by multiplying the amplitude signal AM with the adjusted value A1 which has been read out. Then, the amplitude signal adjustor 1412 inputs the amplitude signal AM which has been adjusted by using the adjusted value A1, into the switch 1414 as an amplitude signal AM1. On the other hand, when the control signal is H, the amplitude signal adjustor 1412 reads out, from the LUT 1413, an adjusted value A2 that corresponds to the instruction voltage indicated by the power level instruction signal. Next, the amplitude signal adjustor 1412 adjusts the level of the amplitude signal AM by multiplying the amplitude signal AM with the adjusted value A2 which has been read out. Then, the amplitude signal adjustor 1412 inputs the amplitude signal AM which has been adjusted by using the adjusted value A2, into the switch 1414 as an amplitude signal AM2.

The switch 1414 includes contact points a to c, and a control signal is inputted to the switch 1414. The switch 1414 connects contact point a and contact point b when the control signal is L, and connects contact point a and contact point c when the control signal is H. Furthermore, contact point b is connected with an input of the collector controller 142, and contact point c is connected with an input of the base controller 143. Thus, when the control signal is L, the amplitude signal AM1 is inputted only into the collector controller 142; and when the control signal is H, the amplitude signal AM2 is inputted only into the base controller 143.

The power level instruction signal and the control signal are inputted into the power control voltage generator 1415. When the control signal is L, the power control voltage generator 1415 read outs a power level control voltage PV1 that corresponds to the instruction voltage indicated by the power level instruction signal, and a power control voltage PV2 which is a direct current, from the LUT 1416 which has been configured with the power level control voltages PV1 and PV1 as shown in FIG. 8. FIG. 8 shows contents stored in the LUT 1416. Next, the power control voltage generator 1415 inputs the power level control voltage PV1 which has been read out, into the collector controller 142; and inputs the power level control voltage PV2 which has been read out, into the base controller 143. On the other hand, when the control signal is H, the power control voltage generator 1415 read outs, from the LUT 1416, a power control voltage PV1 which is a direct current, and a power level control voltage PV2 that corresponds to the instruction voltage indicated by the power level instruction signal. Next, the power control voltage generator 1415 inputs the power level control voltage PV1 which has been read out, into the collector controller 142; and inputs the power level control voltage PV2 which has been read out, into the base controller 143.

In FIG. 2, when the control signal is L, the collector controller 142 is inputted with: the power control voltage PV1 depending on the instruction voltage indicated by the power level instruction signal; and the amplitude signal AM1. Therefore, in this case, the collector controller 142 controls the collector voltage Vc in response to the power control voltage PV1 and the amplitude signal AM1. On the other hand, when the control signal is H, only the power control voltage PV1 which is a direct current is inputted into the collector controller 142. Therefore, in this case, the collector controller 142 generates the collector voltage Vc in accordance with the power control voltage PV1.

As described above, the collector controller 142 conducts a control in accordance with the power control voltage PV1 and the amplitude signal AM1 which are based on the instruction voltage indicated by the power level instruction signal, only when the control signal is L (i.e. when the output power level of the power amplifier 16 is low). A DC voltage is supplied to the collector controller 142 from the power supply terminal 18. A configuration of the collector controller 142 will be described in detail in the following with reference to FIG. 9.

Figure 9:
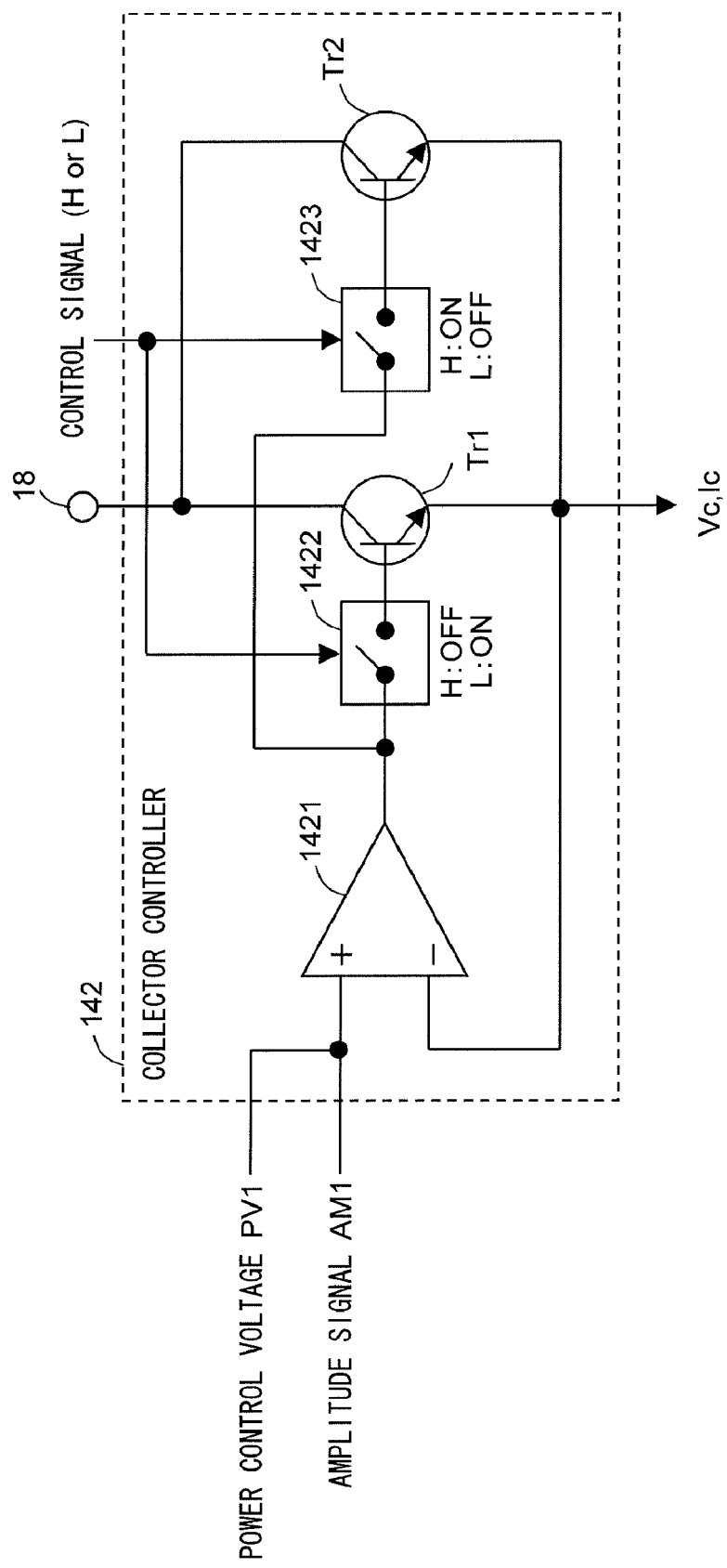
FIG. 9 shows a detailed configuration example of a collector controller 142.

FIG. 9 shows a detailed configuration example of the collector controller 142. In FIG. 9, the collector controller 142 includes: an operational amplifier 1421; a switch 1422; a switch 1423; a transistor Tr1; and a transistor Tr2.

The amplitude signal AM1 and the power control voltage PV1 are inputted to a non-inverting input terminal of the operational amplifier 1421. An inverting input terminal of the operational amplifier 1421 is connected with an emitter terminal of the transistor Tr1, and an output terminal of the operational amplifier 1421 is connected with a terminal at one end of the switch 1422. The switch 1422: is turned on when the inputted control signal is L, and is turned off when the inputted control signal is H. A base terminal of the transistor Tr1 is connected with a terminal at the other end of the switch 1422; and a collector terminal of the transistor Tr1 is connected with the power supply terminal 18; and the emitter terminal of the transistor Tr1 is connected with a collector terminal of the power amplification transistor in the power amplifier 16. A terminal at one end of the switch 1423 is connected to a connection point between the output terminal of the operational amplifier 1421 and the terminal at one end of the switch 1422. The switch 1423: is turned on when the inputted control signal is L; and is turned off when the inputted control signal is H. A base terminal of the transistor Tr2 is connected with a terminal at the other end of the switch 1423; and a collector terminal of the transistor Tr2 is connected with the power supply terminal 18; and an emitter terminal of the transistor Tr2 is connected with the collector terminal of the power amplification transistor in the power amplifier 16.

In FIG. 9, when the control signal is L: the power control voltage PV1 and the amplitude signal AM1, which are in accordance with the instruction voltage indicated by the power level instruction signal, are inputted only to the base terminal of the transistor Tr1 via the operational amplifier 1421 and the switch 1422; and the transistor Tr1 controls the collector voltage Vc in response to the inputted amplitude signal AM1 and power control voltage PV1. On the other hand, when the control signal is H: the power control voltage PV1, which is a direct current, is inputted to the base terminal of the transistor Tr2 via the operational amplifier 1421 and the switch 1423; and the transistor Tr2 generates the collector voltage Vc in accordance with the inputted power control voltage PV1.

The power control voltage PV1 inputted into the transistor Tr2 is a direct current. Therefore, enlarging the size in order to enable a high voltage withstanding ability with regard to the transistor Tr2, do not have any influences on the controlled bandwidth of the collector controller 142. This allows enabling a high voltage withstanding ability for the transistor Tr2; which results in enabling a high voltage withstanding ability for the collector controller 142.

In FIG. 2, when the control signal is L, only the power control voltage PV2 which is a direct current is inputted into the base controller 143. Therefore, in this case, the base controller 143 generates a base bias voltage Vb in accordance with the power control voltage PV2. On the other hand, when the control signal is H, the power control voltage PV2 and the amplitude signal AM2, which are in accordance with the instruction voltage indicated by the power level instruction signal, are inputted into the base controller 143. Therefore, in this case, the base controller 143 controls the base bias voltage Vb in response to the power control voltage PV2 and the amplitude signal AM2.

Figure 10:
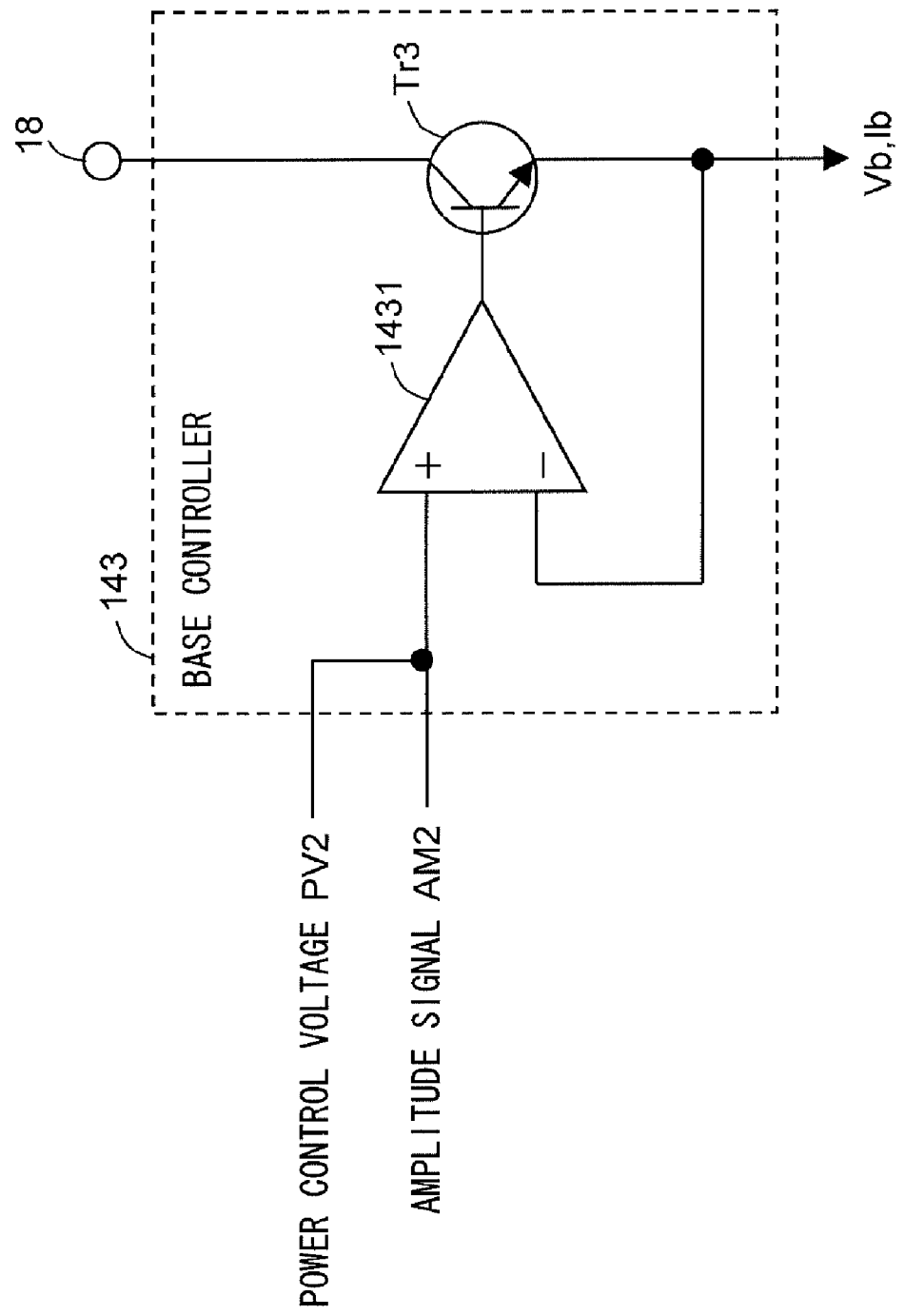
FIG. 10 shows a detailed configuration example of a base controller 143.

As described above, the base controller 143 conducts a control in accordance with the power control voltage PV2 and the amplitude signal AM2, which are based on the instruction voltage indicated by the power level instruction signal, only when the control signal is H (i.e. only when the output power level of the power amplifier 16 is high). A DC voltage is supplied to the base controller 143 from the power supply terminal 18. A configuration of the base controller 143 will be described in detail in the following with reference to FIG. 10. FIG. 10 shows a detailed configuration example of the base controller 143. In FIG. 10, the base controller 143 includes an operational amplifier 1431 and a transistor Tr3.

The amplitude signal AM2 and the power control voltage PV2 are inputted to a non-inverting input terminal of the operational amplifier 1431. An inverting input terminal of the operational amplifier 1431 is connected with an emitter terminal of the transistor Tr3; and an output terminal of the operational amplifier 1431 is connected with a base terminal of the transistor Tr3. A collector terminal of the transistor Tr3 is connected with a power supply terminal 18; and the emitter terminal of the transistor Tr3 is connected with a base terminal of the power amplification transistor in the power amplifier 16.

In FIG. 10, when the control signal is L, the power control voltage PV2, which is a direct current, is inputted to the base terminal of the transistor Tr3 via the operational amplifier 1431; and the transistor Tr3 generates the base bias voltage Vb in accordance with the inputted power control voltage PV2. On the other hand, when the control signal is H, the power control voltage PV2 and the amplitude signal AM2, which are in accordance with the instruction voltage indicated by the power level instruction signal, are inputted to the base terminal of the transistor Tr3 via the operational amplifier 1431; and the transistor Tr3 controls the base bias voltage Vb in response to the inputted amplitude signal AM2 and power control voltage PV2.

In FIG. 2, the phase modulator 15 conducts a phase modulation on an inputted phase signal PM, and inputs the resulting signal as a phase modulation signal into the power amplifier 16. The power amplifier 16 conducts an amplitude modulation on the phase modulation signal, and matches the power level of the phase modulation signal and the power level indicated by the power level signal; by amplifying the phase modulation signal by using the collector voltage Vc controlled by the collector controller 142 when the output power level is low, and by amplifying the phase modulation signal by using the base bias voltage Vb controlled by the base controller 143 when the output power level is high. The phase modulation signal, on which the amplitude modulation is conducted by the power amplifier 16, is outputted by the output terminal 17 as a transmission signal.

Figure 11:
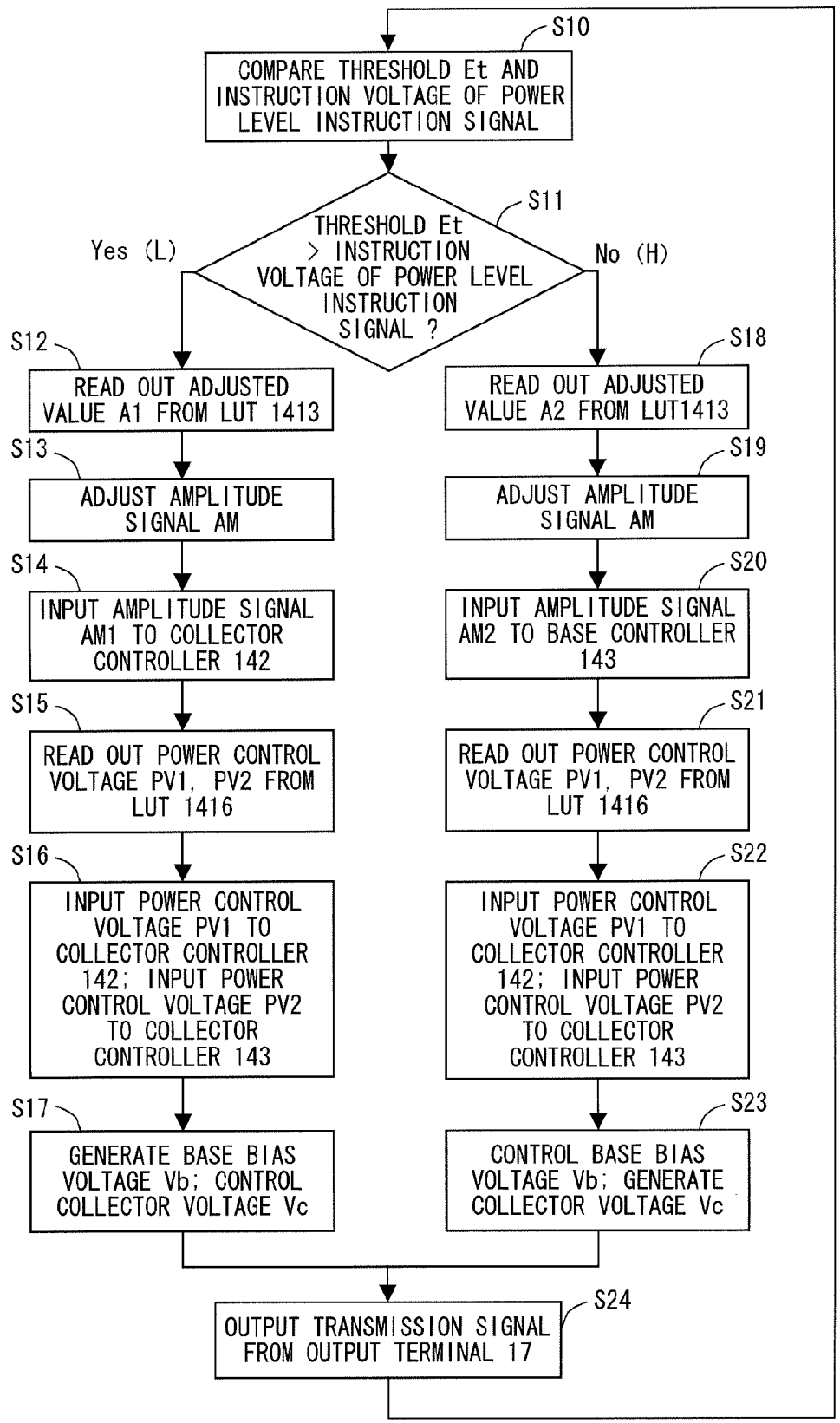
FIG. 11 is a flowchart showing a control process of a voltage controller 14.

A flow of a control process of the voltage controller 14 configured as described above will be described next with reference to FIG. 11. FIG. 11 is a flowchart showing the control process of the voltage controller 14.

At step S10, the comparator 1411 compares the inputted instruction voltage indicated by the power level instruction signal and the threshold Et. Next after step SI 0, the comparator 1411: when the instruction voltage is lower than the threshold Et (Yes), outputs the control signal (L) that indicates this comparison result; or alternatively when the instruction voltage is equal to or larger than the threshold Et (No), outputs the control signal (H) that indicates this alternative comparison result (step S11).

At step S11, if the control signal (L) is outputted, the amplitude signal adjustor 1412 read outs, from the LUT 1413, the adjusted value A1 that corresponds to the instruction voltage indicated by the power level instruction signal (step S12). Next after step S12, the amplitude signal adjustor 1412: adjusts the level of the amplitude signal AM by multiplying the adjusted value A1, which has been read out, with the amplitude signal AM; and inputs the resulting signal as the amplitude signal AM1 into the switch 1414 (step S13). Next after step S13, if the control signal (L) is outputted, the switch 1414 connects the contact point a and contact point b, and inputs the amplitude signal AM1 into the collector controller 142 (step S14). Next after step S14, the power control voltage generator 1415 reads out, from the LUT 1416, the power level control voltage PV1 which corresponds to the instruction voltage indicated by the power level instruction signal and the power control voltage PV2 which is a direct current (step S15). Next after step S15, the power control voltage generator 1415 inputs the power level control voltage PV1 which has been read out, into the collector controller 142, and inputs the power level control voltage PV2 which has been read out, into the base controller 143 (step S16). Next after step S16, the collector controller 142 controls the collector voltage Vc in response to the power control voltage PV1 and the amplitude signal AM1; and the base controller 143 generates the base bias voltage Vb in accordance with the power control voltage PV2 and supplies the base bias voltage Vb to the base terminal of the power amplification transistor in the power amplifier 16 (step S17).

On the other hand, at step S11, if the control signal (H) is outputted, the amplitude signal adjustor 1412 reads out, from the LUT 1413, the adjusted value A2 that corresponds to the instruction voltage indicated by the power level instruction signal (step S18). Next after step S18, the amplitude signal adjustor 1412 adjusts the level of the amplitude signal AM by multiplying the amplitude signal AM with the adjusted value A2 which has been read out; and inputs the resulting signal into the switch 1414 as the amplitude signal AM2 (step S19). Next after step S19, the switch 1414 connects contact point a and contact point c if the control signal (H) is outputted, and inputs the amplitude signal AM2 into the base controller 143 (step S20). Next after step S20, the power control voltage generator 1415 reads out, from the LUT 1416 the power control voltage PV1 which is a direct current, and a power level control voltage PV2 that corresponds to the instruction voltage indicated by the power level instruction signal (step S21). Next after step S21, the power control voltage generator 1415 inputs the power level control voltage PV1 which has been read out, into the collector controller 142; and inputs the power level control voltage PV2 which has been read out, into the base controller 143 (step S22). Next after step S22, the collector controller 142 generates the collector voltage Vc in accordance with the power control voltage PV1 and supplies the collector voltage Vc to the collector terminal of the power amplification transistor in the power amplifier 16; and the base controller 143 controls the base bias voltage Vb in response to the power control voltage PV2 and the amplitude signal AM2 (step S23).

Next after step S17 or step S23, the power amplifier 16 conducts an amplitude modulation on the phase modulation signal, and matches the power level of the phase modulation signal and the power level indicated by the power level signal; by amplifying the phase modulation signal by using the collector voltage Vc controlled by the collector controller 142 when the output power level is low, and by amplifying the phase modulation signal by using the base bias voltage Vb controlled by the base controller 143 when the output power level is high. Then, the phase modulation signal, on which the amplitude modulation is conducted by the power amplifier 16, is outputted by the output terminal 17 as a transmission signal (step S24).

As described above, with the transmission circuit 1 according to the current embodiment, the voltage controller 14 controls the collector voltage when the output power level of the power amplifier 16 is low, and controls the base bias voltage when the output power level of the power amplifier 16 is high. As a result, the controlled bandwidth of the voltage controller can be further broadened while ensuring voltage-withstanding ability of the voltage controller.

Furthermore, by having the threshold determiner 12 determine the threshold Et in response to an acceptable value of the control sensitivity of Vb, the control range of Pout can be broadened while easily controlling Pout.

Although the threshold Et is determined by the threshold determiner 12 in the description above, it is not limited to this manner. The threshold Et itself may be directly configure in the voltage controller 14 without having the threshold determiner 12 or the LUT 13.

Furthermore, in the examples in FIG. 9 and FIG. 10, the transistors Tr1 to Tr3 are configured from bipolar transistors; however, the transistors may also be configured from field effect transistors such as FETs.

Figure 12:
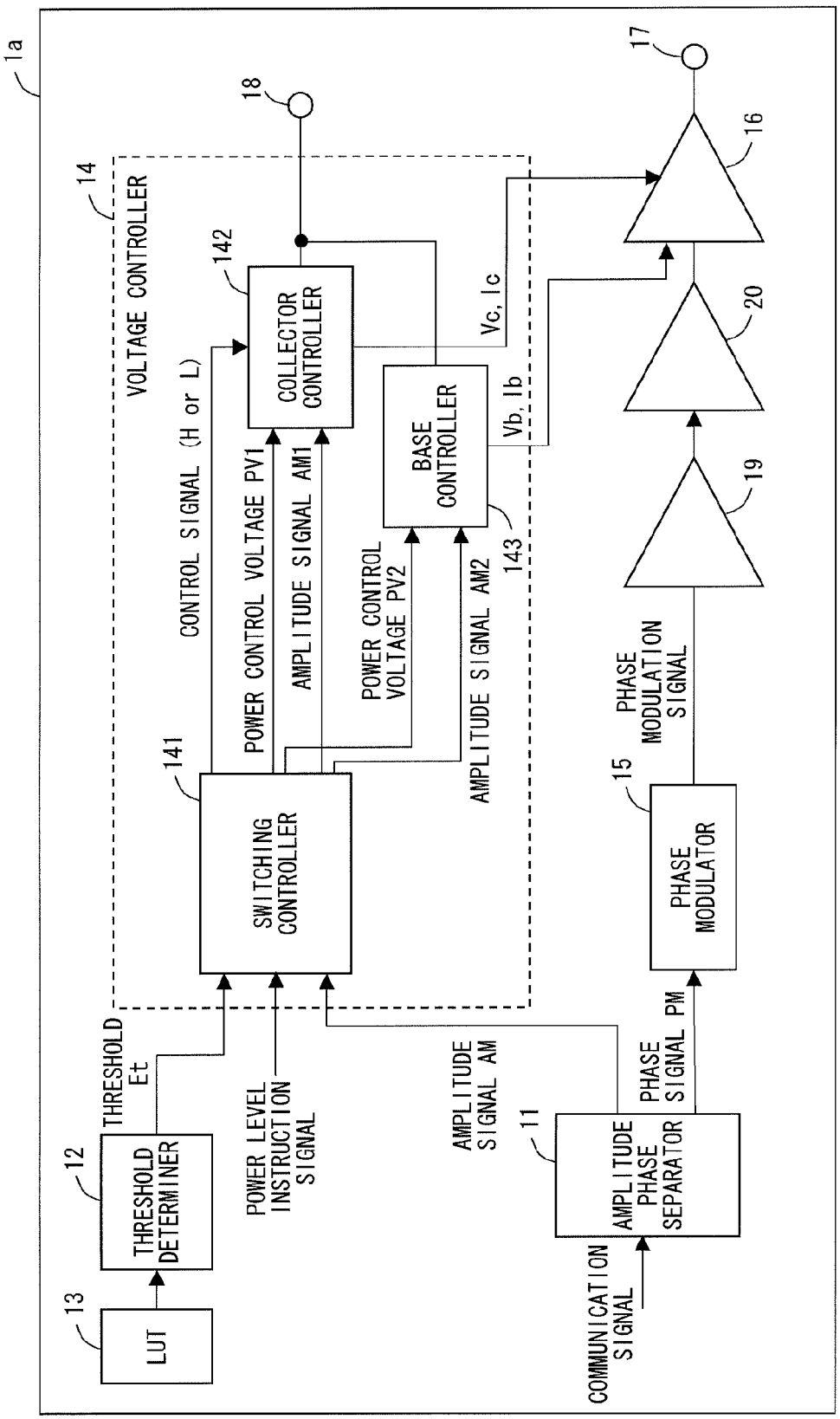
Figure 13:
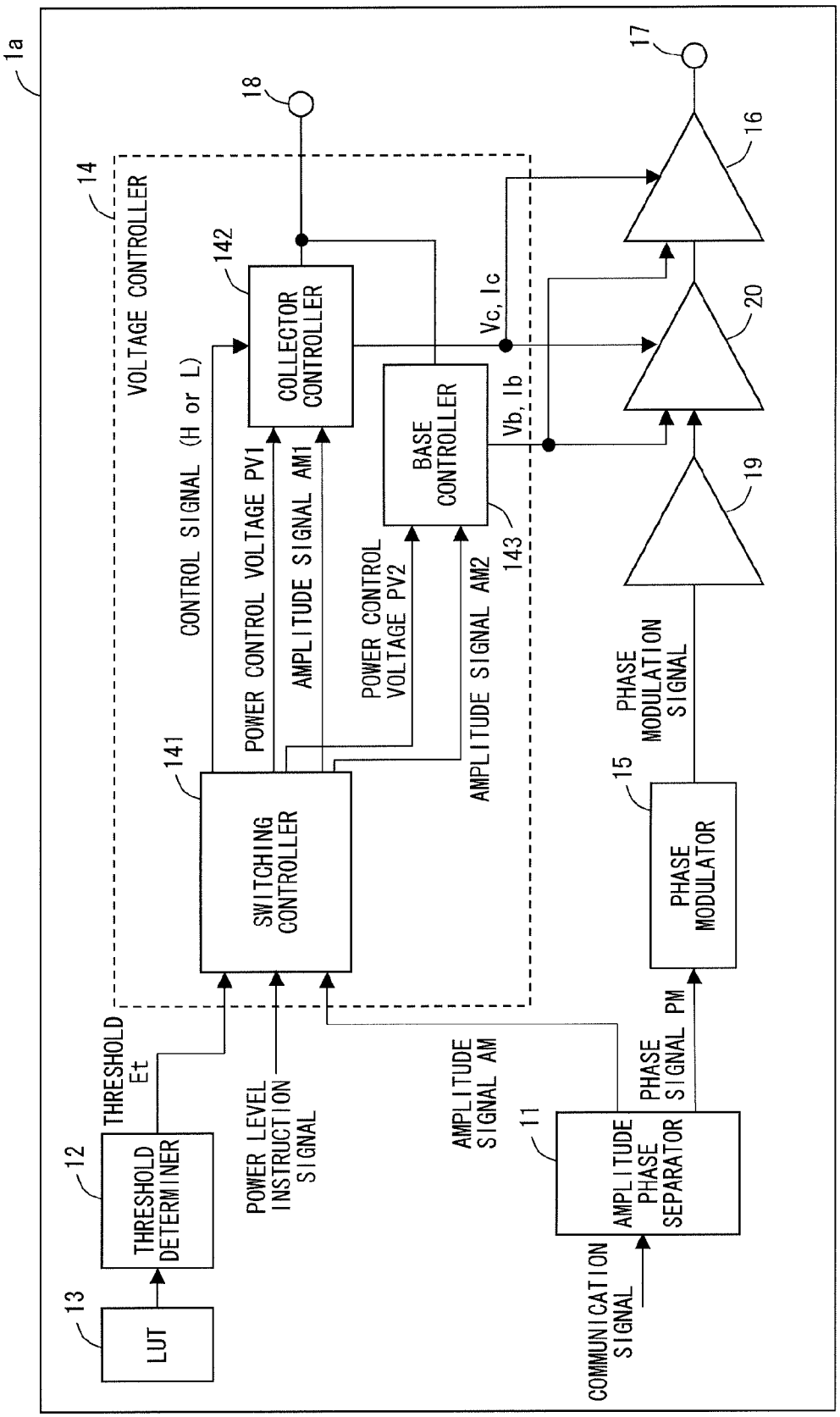
Figure 14:
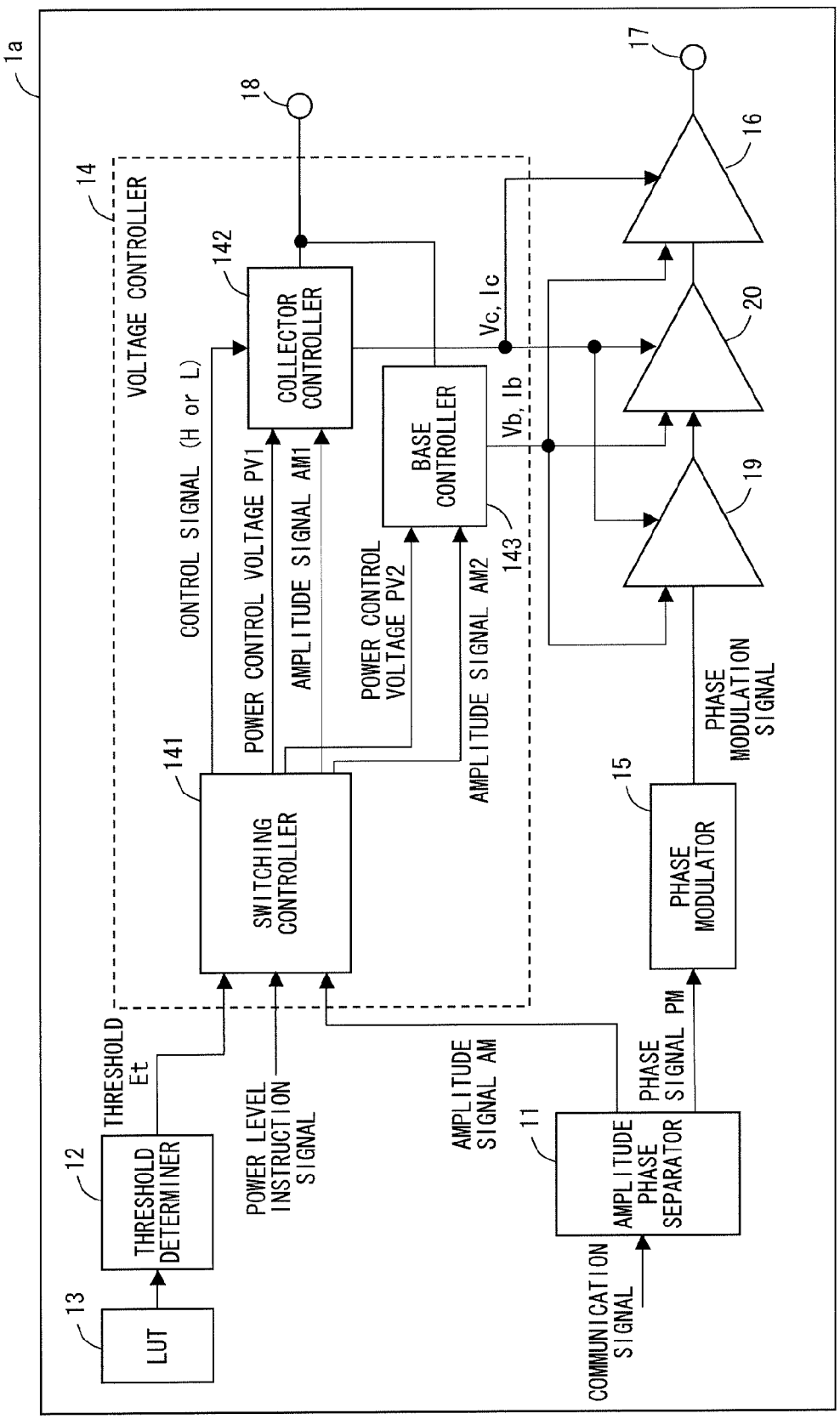

In addition, the transmission circuit 1 has a configuration that includes a single power amplifier 16 in the description above; however, a plurality of power amplifiers may be included, as with the case of a transmission circuit 1a shown in FIG. 12. FIG. 12 is a block diagram showing a configuration example of the transmission circuit 1a. In the example in FIG. 12, the transmission circuit 1a includes three power amplifiers 16, 19, and 20, which are connected forming multiple stages. Also in the example in FIG. 12, the collector voltage and the base bias voltage from the voltage controller 14 are supplied to the power amplifier 16 which is at a subsequent stage. However, the collector voltage and the base bias voltage from the voltage controller 14 may also be supplied to both the power amplifier 16 which is at a subsequent stage and the power amplifier 20 which is at a middle stage, as shown in FIG. 13; or may also be supplied to all the power amplifiers 16, 19, and 20, as shown in FIG. 14. FIG. 13 and FIG. 14 are block diagrams showing other configuration examples of the transmission circuit 1a.

Second Embodiment

Figure 15:
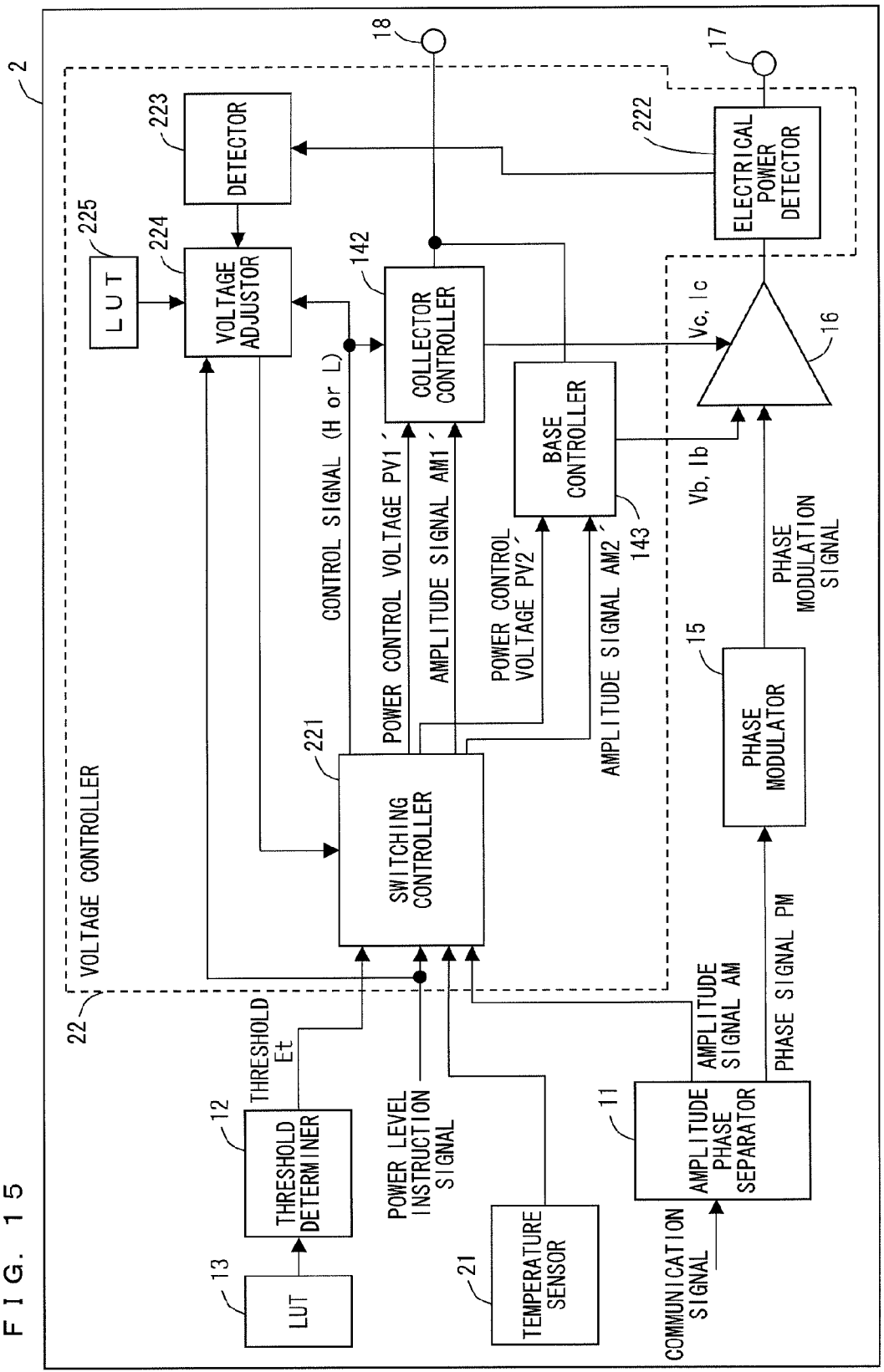
FIG. 15 is a block diagram showing a configuration example of a transmission circuit 2 according to a second embodiment.

Described next with reference to FIG. 15 is a configuration of a transmission circuit 2 according to a second embodiment of the present invention. FIG. 15 is a block diagram showing a configuration example of the transmission circuit 2 according to the second embodiment. The transmission circuit 2 is obtained by adding a temperature compensation function to the transmission circuit 1 shown in FIG. 2. The transmission circuit 2 differs from the transmission circuit 1 in FIG. 2 in that, a temperature sensor 21 is further included and the voltage controller 14 is substituted with a voltage controller 22. All the other components possess the same functions as in the transmission circuit 1 in FIG. 2, and are denoted with the same reference characters and detailed descriptions of them are omitted.

The temperature sensor 21 is a sensor that detects the surrounding temperature, and inputs a temperature signal indicating a detected surrounding temperature into the voltage controller 22.

The voltage controller 22 differs from the voltage controller 14 in FIG. 2 in that, the switching controller 141 is substituted with a switching controller 221, and an electrical power detector 222, a detector 223, a voltage adjustor 224, and a LUT 225 are further included. All the other components possess the same functions as in the voltage controller 14 in FIG. 2; and are denoted with the same reference characters and detailed descriptions of them are omitted.

The electrical power detector 222 is connected with an output of the power amplifier 16, and detects an output power of the power amplifier 16. The detector 223 converts the output power of the power amplifier 16 detected by the electrical power detector 222 into an output voltage. The power level instruction signal, a control signal outputted from the switching controller 221, and the output voltage detected by the detector 223 are inputted into the voltage adjustor 224. The voltage adjustor 224 reads out an adjusted value that corresponds to the instruction voltage indicated by the control signal and the power level instruction signal, from the LUT 225 which has been configured with adjusted values, as shown in FIG. 16. FIG. 16 shows contents stored in the LUT 225. Next, the voltage adjustor 224 adjusts the output voltage detected by the detector 223, by multiplying the adjusted value which has been read out with the output voltage detected by the detector 223. In FIG. 16, the constant numbers a1, a2, etc., described in the column that represents the case when a comparator output is L (i.e. when the control signal is L), are determined such that the output voltage detected by the detector 223 becomes identical to the power control voltage PV1 outputted from the switching controller 221 when the surrounding temperature is 25° C. In addition, the constant numbers b1, b2, etc., described in the column that represents the case when the comparator output is H (i.e. when the control signal is H), are determined such that the output voltage detected by the detector 223 becomes identical to the power control voltage PV2 outputted from the switching controller 221 when the surrounding temperature is 25° C. The power control voltages PV1 and PV2, which are outputted from the switching controller 221 when the surrounding temperature is 25° C., are determined by referencing the LUT 1416.

Figure 17:
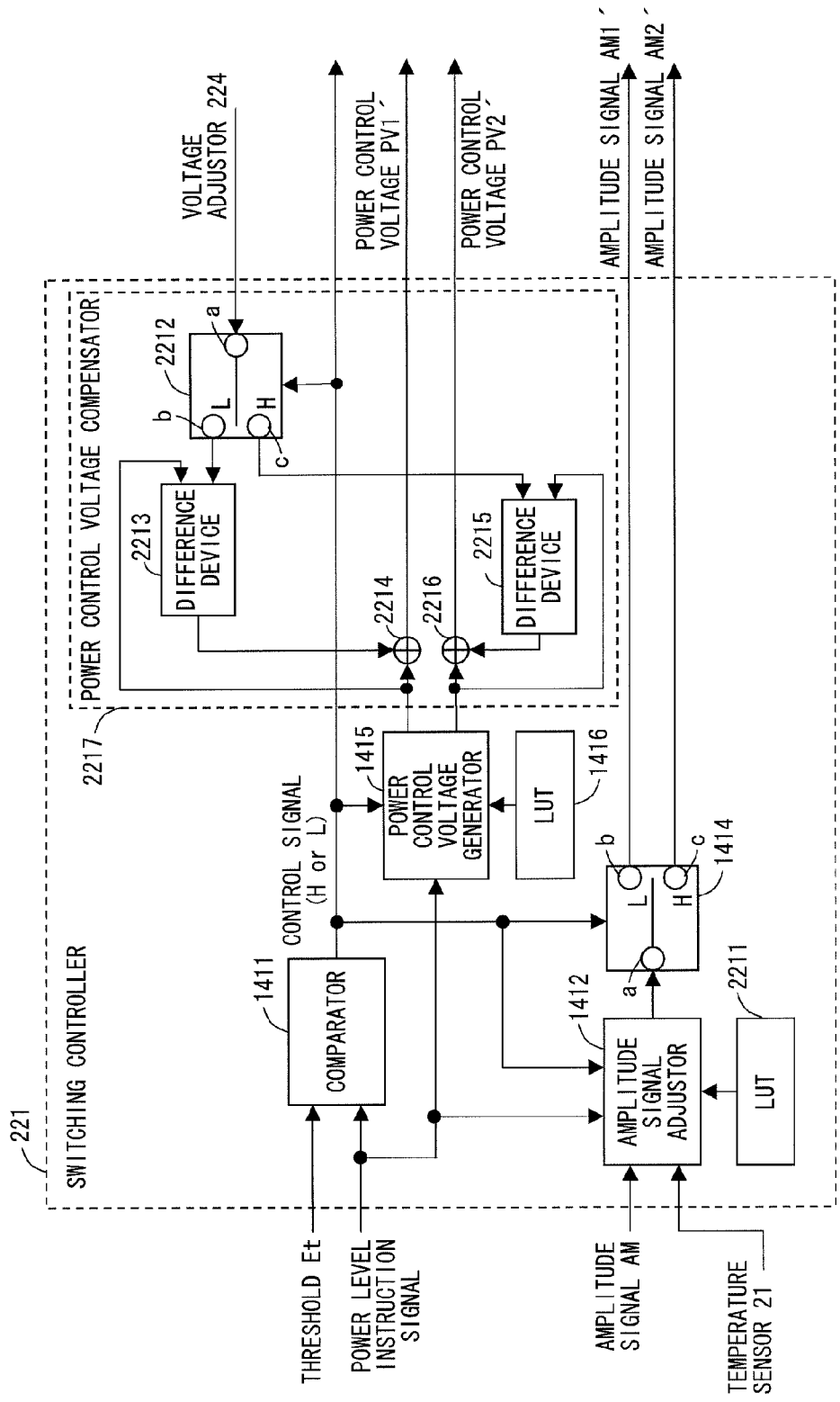
FIG. 17 is a block diagram showing a configuration example of a switching controller 221.

As shown in FIG. 17, the switching controller 221 differs from the switching controller 141 in FIG. 6 in that, the LUT 1413 is substituted with a LUT 2211, and a switch 2212, a difference device 2213, an adder 2214, a difference device 2215, and an adder 2216 are further included as a power control voltage compensator 2217. FIG. 17 is a block diagram showing a configuration example of the switching controller 221. All the other components possess the same functions as in the switching controller 141 in FIG. 6, and are denoted with the same reference characters and detailed descriptions of them are omitted.

The temperature signal from the temperature sensor 21, the amplitude signal AM, the power level instruction signal and the control signal are inputted into the amplitude signal adjustor 1412. When the control signal is L, the amplitude signal adjustor 1412 read outs the adjusted value A1 that corresponds to the instruction voltage indicated by the temperature signal and the power level instruction signal, from the LUT 2211 which has been configured with adjusted values A1 and A2 as shown in FIG. 18. FIG. 18 shows contents stored in the LUT 2211. Next, the amplitude signal adjustor 1412 adjusts the level of the amplitude signal AM while conducting the temperature compensation, by multiplying the amplitude signal AM with the adjusted value A1 which has been read out. Then, the amplitude signal adjustor 1412 inputs the amplitude signal AM, in which the temperature compensation has been conducted by using the adjusted value A1, into the switch 1414 as an amplitude signal AM1'. On the other hand, when the control signal is H, the amplitude signal adjustor 1412 reads out, LUT 2211, the adjusted value A2 that corresponds to the instruction voltage indicated by the temperature signal and the power level instruction signal. Next, the amplitude signal adjustor 1412 adjusts the level of the amplitude signal AM while conducting the temperature compensation, by multiplying the amplitude signal AM with the adjusted value A2 which has been read out. Then, the amplitude signal adjustor 1412 inputs the amplitude signal AM, in which the temperature compensation has been conducted by using the adjusted value A2, into the switch 1414 as an amplitude signal AM2'.

The power level instruction signal and the control signal are inputted into the power control voltage generator 1415. When the control signal is L, the power control voltage generator 1415 read outs, from the LUT 1416, a power level control voltage PV1 that corresponds to the instruction voltage indicated by the power level instruction signal, and a power control voltage PV2 which is a direct current. Next, the power control voltage generator 1415 inputs the power level control voltage PV1 which has been read out, into the adder 2214; and inputs the power level control voltage PV2 which has been read out, into the adder 2216. On the other hand, when the control signal is H, the power control voltage generator 1415 read outs, from the LUT 1416, a power control voltage PV1 which is a direct current, and a power level control voltage PV2 that corresponds to the instruction voltage indicated by the power level instruction signal. Next, the power control voltage generator 1415 inputs the power level control voltage PV1 which has been read out, into the adder 2214; and inputs the power level control voltage PV2 which has been read out, into the adder 2216.

The switch 2212 includes contact points a to c, and the control signal and an output voltage that is adjusted by the voltage adjustor 224 are inputted to the switch 2212. The switch 2212 connects contact point a and contact point b when the control signal is L, and connects contact point a and contact point c when the control signal is H. Furthermore, contact point b is connected with an input of the difference device 2213; and contact point c is connected with an input of the difference device 2215. Thus, when the control signal is L, the output voltage adjusted by the voltage adjustor 224 is inputted only into the difference device 2213; and when the control signal is H, the output voltage adjusted by the voltage adjustor 224 is inputted only into the difference device 2215.

The power level control voltage PV1 and the output voltage adjusted by the voltage adjustor 224 are inputted into the difference device 2213 only when the control signal is L. Only when the control signal is L, the difference device 2213 calculates a difference voltage between the power level control voltage PV1 and the output voltage adjusted by the voltage adjustor 224, and inputs the calculated difference voltage into the adder 2214. The power level control voltage PV1 outputted from the power control voltage generator 1415, and the difference voltage outputted from the difference device 2213 are inputted into the adder 2214, only when the control signal is L. Only when the control signal is L, the adder 2214 adds the power level control voltage PV1 and the difference voltage, and inputs the resulting voltage into the collector controller 142 as a power level control voltage PV1'.

The power level control voltage PV2 and the output voltage adjusted by the voltage adjustor 224 are inputted into the difference device 2215 only when the control signal is H. Only when the control signal is H, the difference device 2215 calculates a difference voltage between the power level control voltage PV2 and the output voltage adjusted by the voltage adjustor 224, and inputs the calculated difference voltage into the adder 2216. The power level control voltage PV2 outputted from the power control voltage generator 1415, and the difference voltage outputted from the difference device 2215 are inputted into the adder 2216 only when the control signal is H. Only when the control signal is H, the adder 2216 adds the power level control voltage PV2 and the difference voltage, and inputs the resulting voltage into the base controller 143 as a power level control voltage PV2'.

As described above, when the control signal is L, the power control voltage compensator 2217 inputs the power level control voltage PV1' which is compensated such that the output power level of the power amplifier 16 and the power level indicated by the power level signal matches each other, into the collector controller 142 which conducts the collector voltage control. On the other hand, when the control signal is H, the power control voltage compensator 2217 inputs the power level control voltage PV2' which is compensated such that the output power level of the power amplifier 16 and the power level indicated by the power level signal matches each other, into the base controller 143 which conducts the base bias voltage control.

As described above, with the transmission circuit 2 according to the current embodiment, the power level control voltage PV1', which is compensated such that the output power level of the power amplifier 16 and the power level signal matches each other, and the amplitude signal AM1', in which the temperature compensation has been conducted, are inputted into the collector controller 142 that conducts the collector voltage control. Additionally, the power level control voltage PV2', which is compensated such that the output power level of the power amplifier 16 and the power level signal matches each other, and the amplitude signal AM2, in which the temperature compensation has been conducted, are inputted into the conduct base controller 143 that conducts the base bias voltage control. With this, the output power level of the power amplifier 16 and the power level signal can be matched even when the surrounding temperature changes.

Furthermore, it is also possible to cancel a difference of the output power level of the power amplifier 16 before and after control switching, caused by a difference between the control sensitivities of collector voltage control and base bias voltage control, by inputting the power level control voltage PV1' into the collector controller 142 and inputting the power level control voltage PV2' into the base controller 143.

Figure 19:
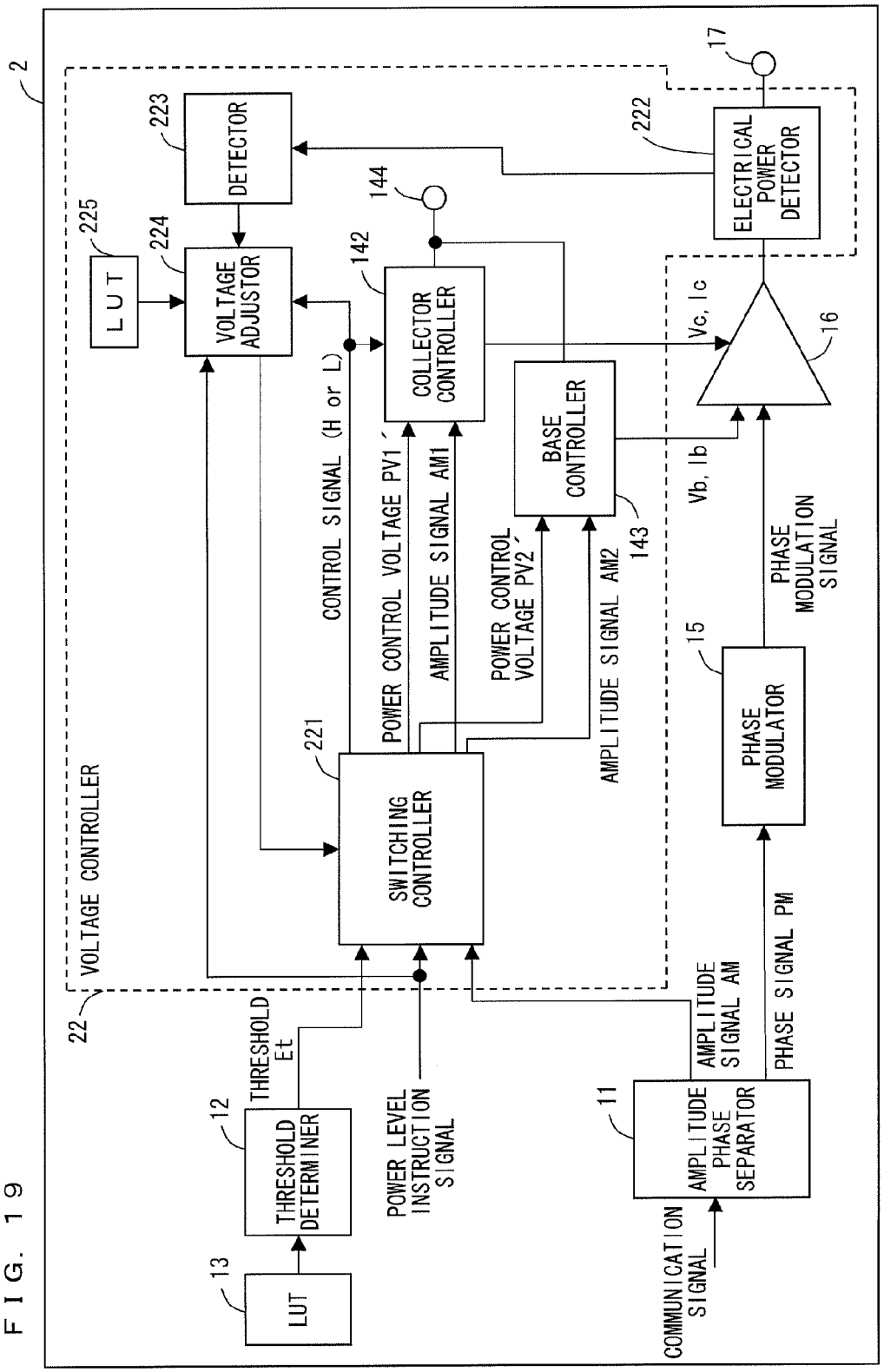
FIG. 19 is a block diagram showing another configuration example of the transmission circuit 2.
Figure 20:
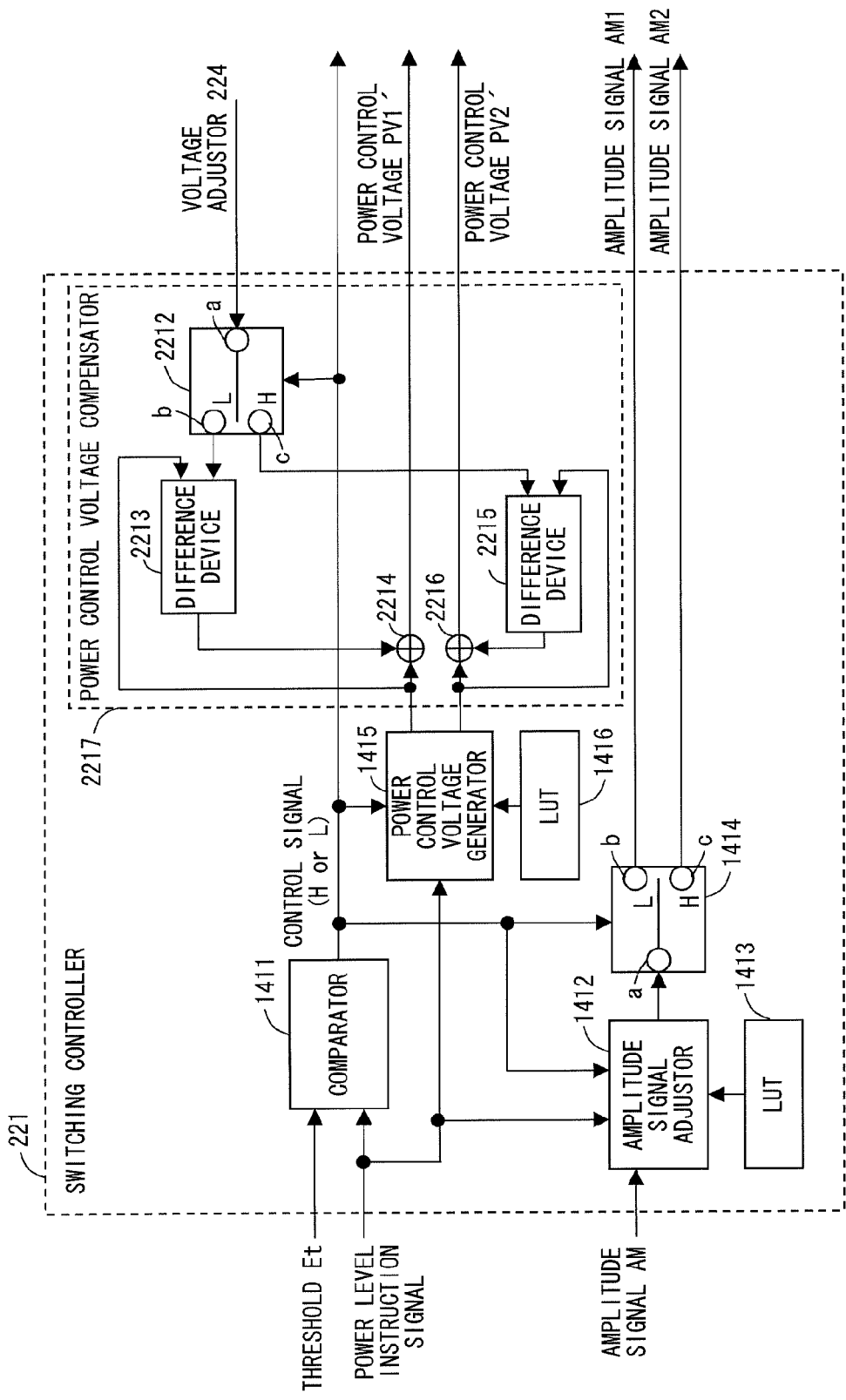
FIG. 20 is a block diagram showing another configuration example of the switching controller 221.

Furthermore, if canceling, the difference of the output power level of the power amplifier 16 before and after control switching caused by the difference between the control sensitivities of collector voltage control and base bias voltage control, is the only objective; the transmission circuit 2 may further include components that conduct the temperature compensation on the amplitude signal, as shown in FIG. 19 and FIG. 20. FIG. 19 is a block diagram showing another configuration example of the transmission circuit 2. When compared to the transmission circuit 1 shown in FIG. 2, the transmission circuit 2 further includes the electrical power detector 222, the detector 223, the voltage adjustor 224, and the LUT 225. FIG. 20 is a block diagram showing another configuration example of the switching controller 221. When compared to the switching controller 141 shown in FIG. 6, the switching controller 221 further includes the switch 2212, the difference device 2213, the adder 2214, the difference device 2215 and the adder 2216 as the power control voltage compensator 2217.

Although the LUT 2211 stores adjusted values A1 and A2 for every temperature in the description above, it is not limited to this manner. The LUT 2211 may, for example, store: the adjusted values A1 and A2 for 25° C.; and a compensation factor which is utilized for obtaining adjusted values A1 and A2 for various temperatures by using the adjusted values A1 and A2 for 25° C. as standards. In this case, the amplitude signal adjustor 1412, for example, reads out, the adjusted value A1 that corresponds to the instruction voltage indicated by the power level instruction signal, and the compensation factor that corresponds to the temperature signal; and multiplies the adjusted value A1 which has been read out and the compensation factor. With this, the final adjusted value is obtained.

Figure 21:
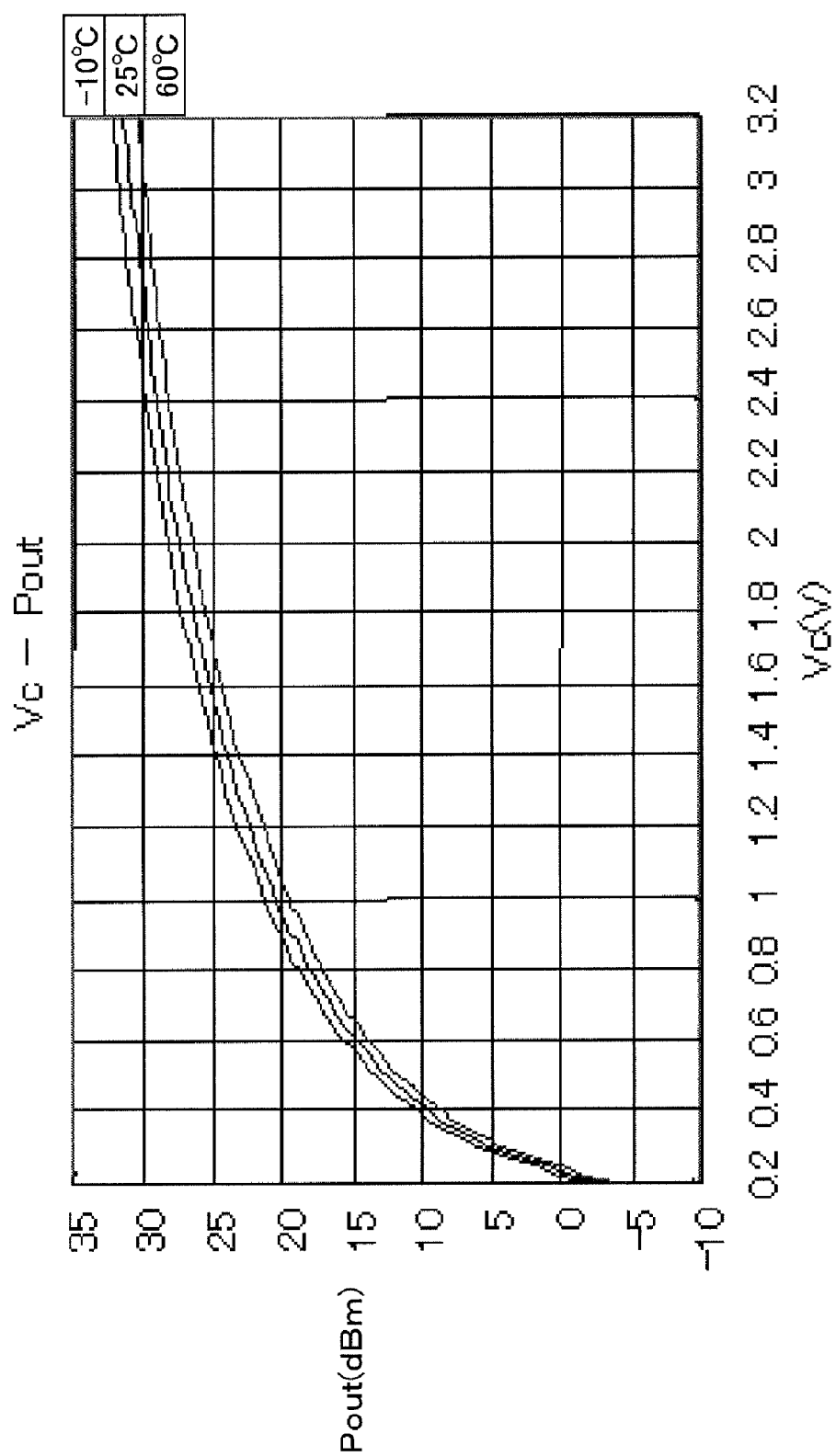
FIG. 21 shows the Vc-Pout characteristics at various temperatures.

A temperature compensation for the threshold determiner 12 has not been mentioned in particular in the description above; however, in fact the threshold determiner 12 may compensate the threshold Et based on the temperature signal from the temperature sensor 21. Here, the Vc-Pout characteristics and the Vb-Pout characteristics change depending on the temperature, as shown in FIG. 21 and FIG. 22. FIG. 21 shows the Vc-Pout characteristics at various temperatures; and FIG. 22 shows the Vb-Pout characteristics at various temperatures. In this case, the Vb-Pout characteristics at various temperatures shown in FIG. 22, and the power level signal—power level instruction signal characteristics are stored in the LUT 13. The threshold determiner 12 references the Vb-Pout characteristics in the LUT 13 corresponding to the temperature signal, and compensates the determined Pout threshold Ept to become the Pout that is obtained when the control sensitivity of Vb becomes an acceptable value. Then the threshold determiner 12 compensates the threshold Et, based on the compensated Pout threshold Ept, while referencing the power level signal—power level instruction signal characteristics in the LUT 13.

Instead of the Vb-Pout characteristics at various temperatures shown in FIG. 22, the Vb-Pout characteristic at 25° C., and a compensation factor which is utilized for obtaining Pout threshold Ept in the Vb-Pout characteristics at various temperatures by using Pout threshold Ept in the Vb-Pout characteristics at 25° C. as a standard, may be stored in the LUT 13. In this case, the threshold determiner 12 reads out a compensation factor that corresponds to the temperature signal from the LUT 13; and multiplies the compensation factor which has been read out with Pout threshold Ept in the Vb-Pout characteristics at 25° C. With this, the final Pout threshold Ept is obtained. Then the threshold determiner 12 compensates the threshold Et, based on the obtained Pout threshold Ept, while referencing the power level signal—power level instruction signal characteristics in the LUT 13.

Third Embodiment

Figure 23:
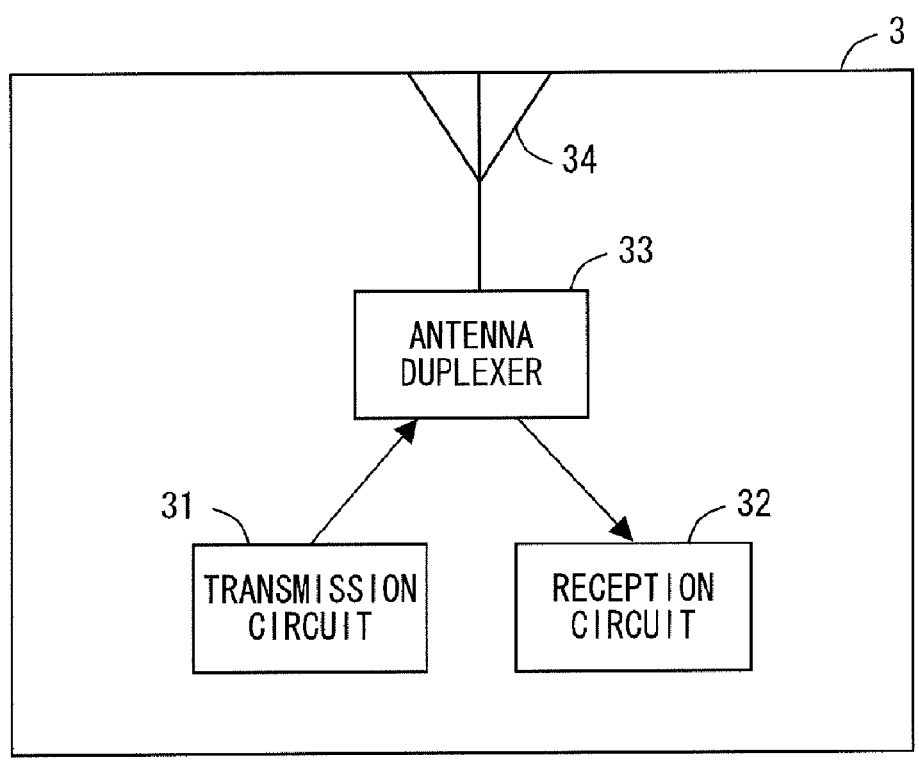
FIG. 23 is a block diagram showing a configuration example of a communication device 3 according to a third embodiment of the present invention.
Figure 24:
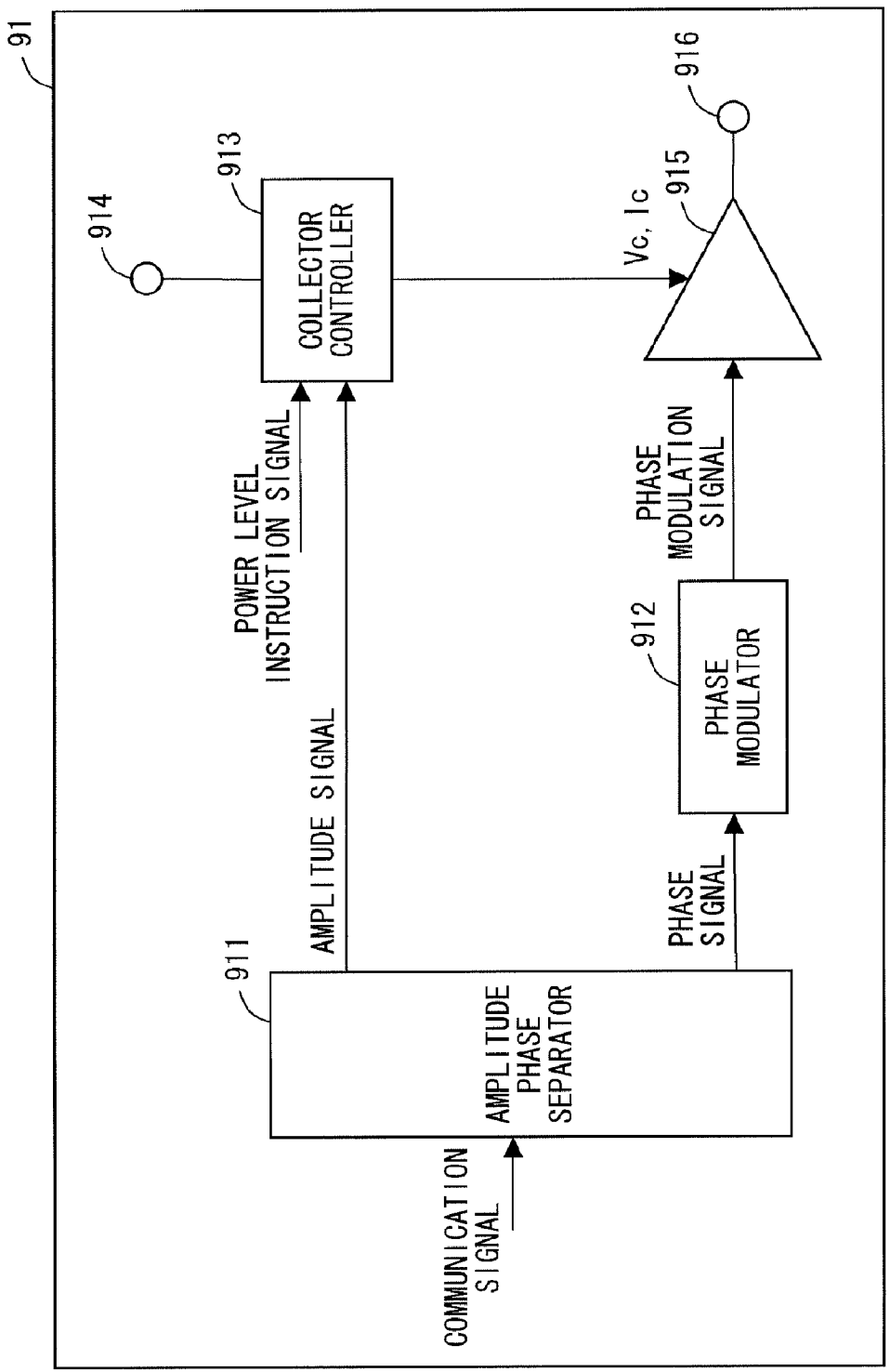
FIG. 24 is a block diagram showing a configuration of a conventional transmission circuit 91.
Figure 25:
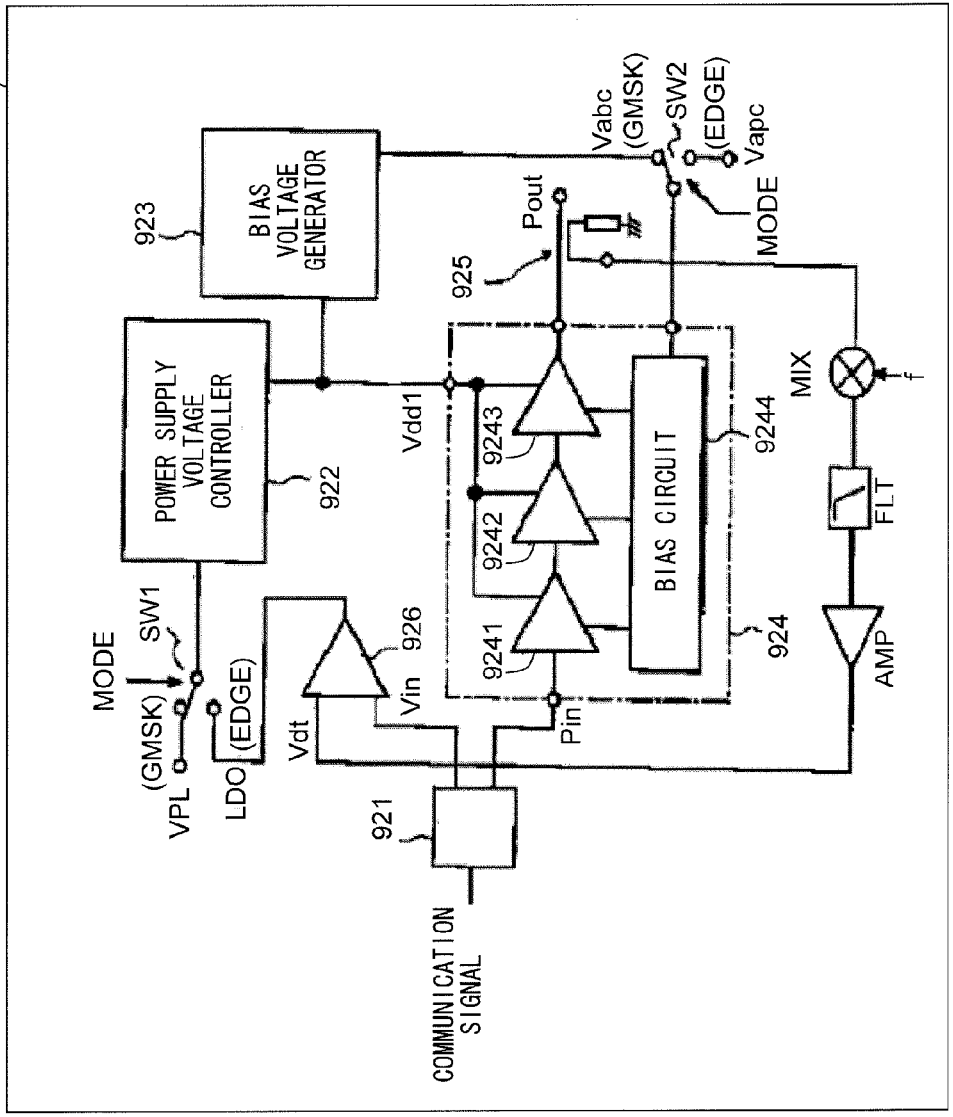
FIG. 25 is a block diagram showing a configuration of a conventional transmission circuit 92.
Figure 26:
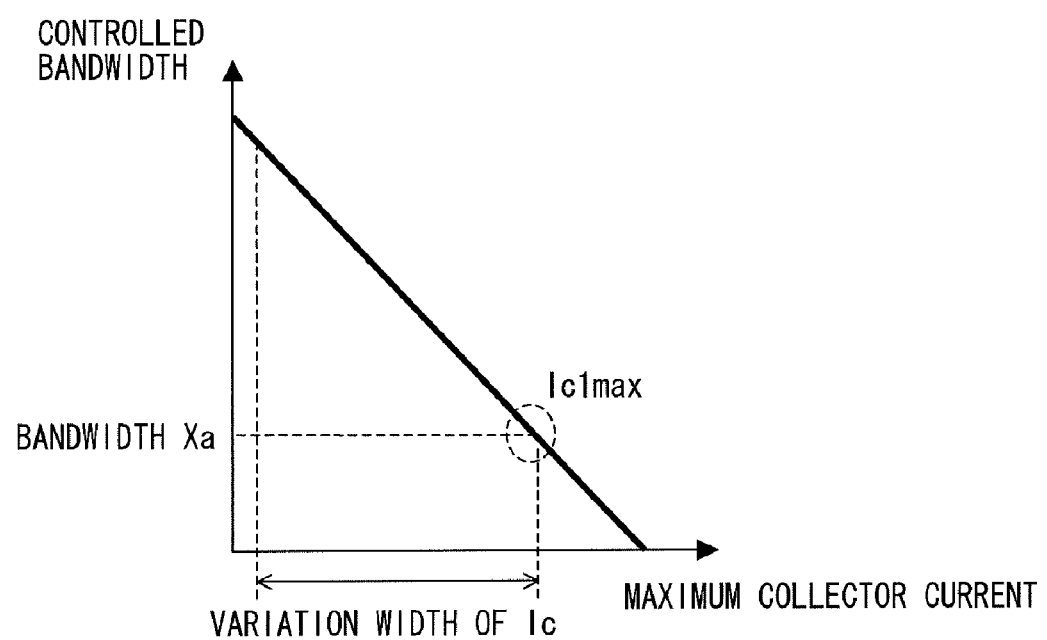
FIG. 26 shows a relationship between a maximum collector electric current and a controlled bandwidth when using a voltage controller in the transmission circuit 91.

A configuration of a communication device 3 according to a third embodiment of the present invention is described next with reference to FIG. 23. FIG. 23 is a block diagram showing a configuration example of the communication device 3 according to the third embodiment of the present invention. In FIG. 23, the communication device 3 includes: a transmission circuit 31; a reception circuit 32; an antenna duplexer 33; and an antenna 34. The transmission circuit 31 is identical to the transmission circuit according to either the first or second embodiment described above. The antenna duplexer 33 transmits a transmission signal outputted from the transmission circuit 31, to the antenna 34; and prevents the transmission signal from leaking into the reception circuit 32. Furthermore, the antenna duplexer 33 transmits a reception signal inputted from the antenna 34, to the reception circuit 32; and prevents the reception signal from leaking into the transmission circuit 31. Therefore, the transmission signal is outputted from the transmission circuit 31; and released out into external space from the antenna 34 via the antenna duplexer 33. The reception signal is received by the antenna 34, and then received by the reception circuit 32 via the antenna duplexer 33.

By using the transmission circuit according to either the first or second embodiment, the communication device 3 can conduct a communication at a broader bandwidth. Furthermore, the communication device 3 may have a configuration that includes only the transmission circuit 31 and the antenna 34.

The transmission circuit according to the present invention can further broaden the controlled bandwidth of a built-in voltage controller while ensuring voltage withstanding ability of the voltage controller, and can be applied to a communication device such as a mobile phone and the like.

While the invention has been described in detail, the foregoing description is in all aspects illustrative and not restrictive. It is understood that numerous other modifications and variations can be devised without departing from the scope of the invention.

What is claimed is:

1. A transmission circuit that outputs a transmission signal having a power level indicated by a power level signal which is transmitted from a predefined base station, the transmission circuit comprising:
    an amplitude phase separator that separates an input signal into an amplitude signal that indicates an amplitude component and a phase signal that indicates a phase component
    a phase modulator that conducts a phase modulation on the phase signal and outputs a phase modulation signal;
    a power amplifier which (i) includes a transistor, (ii) amplifies the phase modulation signal using the transistor and (iii) outputs the amplified phase modulation signal as the transmission signal;
    a collector controller that controls a collector voltage supplied to the transistor;
    a base controller that controls a base bias voltage supplied to the transistor; and
    a switching controller, which (i) receives the power level signal from the predefined base station, (ii) switches, when the power level indicated by the power level signal is lower than a predefined value, to control the collector controller in accordance with the amplitude signal and the power level signal and to control the base controller in accordance with the power level signal, and (iii) switches, when the power level indicated by the power level signal is equal to or more than the predefined value, to control the base controller in accordance with the amplitude signal and the power level signal and to control the collector controller in accordance with the power level signal,
    wherein the power amplifier amplifies the phase modulation signal based on the collector voltage and the base bias voltage controlled by the collector controller and the base controller.

2. The transmission circuit according to claim 1, wherein the switching controller comprises:
    a comparator which (i) compares a predefined threshold value and an instruction voltage indicated by a power level instruction signal generated by having the power level signal converted by an external circuit, and (ii) outputs one of a first control signal indicating that the instruction voltage is lower than the predefined threshold value and a second control signal indicating that the instruction voltage is equal to or more than the predefined threshold value;
    an amplitude signal adjustor, which (i) adjusts, when the first control signal is outputted by the comparator, a level of the amplitude signal based on the instruction voltage and inputs the adjusted amplitude signal, as a first amplitude signal, into the collector controller, and (ii) adjusts, when the second control signal is outputted by the comparator, the level of the amplitude signal based on the instruction voltage and inputs the adjusted amplitude signal, as a second amplitude signal, into the base controller; and
    a power control voltage generator, which (i) inputs, when the first control signal is outputted by the comparator, a first power control voltage that is in accordance with the instruction voltage, into the collector controller, and (ii) inputs, when the second control signal is outputted by the comparator, a second power control voltage that is in accordance with the instruction voltage, into the base controller.

3. The transmission circuit according to claim 2, wherein the power control voltage generator further inputs, when the second control signal is outputted by the comparator, a third power control voltage, which is a direct current, into the collector controller, and
    wherein the collector controller comprises:
        a first transistor that controls the collector voltage supplied to the transistor in the power amplifier, the first transistor controlling the collector voltage in response to the first amplitude signal and the first power control voltage; and
        a second transistor that controls the collector voltage supplied to the transistor in the power amplifier, the second transistor controlling the collector voltage based on the third power control voltage.

4. The transmission circuit according to claim 2, further comprising a threshold determiner that determines the predefined threshold value based on a power level that is obtained when a change ratio, which is a ratio of the power level of the transmission signal to the base bias voltage controlled by the base controller, becomes an acceptable value.

5. The transmission circuit according to claim 2, wherein the switching controller further comprises a power control voltage compensator that compensates, based on the power level of the transmission signal outputted from the power amplifier, the first power control voltage and the second power control voltage which are outputted from the power control voltage generator, such that the power level of the transmission signal outputted from the power amplifier matches the power level indicated by the power level signal.

6. The transmission circuit according to claim 5, further comprising a temperature sensor that detects a temperature,
    wherein the amplitude signal adjustor changes a degree of the adjustment of the level of the amplitude signal based on the temperature detected by the temperature sensor.

7. The transmission circuit according to claim 5, further comprising:
    a threshold determiner that determines the predefined threshold value based on a power level that is obtained when a change ratio, which is a ratio of the power level of the transmission signal to the base bias voltage controlled by the base controller, becomes an acceptable value; and
    a temperature sensor that detects a temperature,
    wherein the threshold determiner further compensates the predefined threshold value based on the temperature detected by the temperature sensor.

8. The transmission circuit according to claim 1, further comprising at least one additional power amplifier,
    wherein the at least one additional power amplifier is provided at a stage that is antecedent of the power amplifier, resulting in multiple stages of power amplifiers,
    wherein the at least one additional power amplifier is different from the power amplifier, wherein the at least one additional power amplifier includes a transistor, and wherein the at least one additional power amplifier amplifies the phase modulation signal, which is output from the phase modulator, using the transistor of the at least one additional power amplifier, and inputs the phase modulation signal amplified by the transistor of the at least one additional power amplifier into the power amplifier.

9. A communication device comprising:

the transmission circuit according to claim 1 that outputs the transmission signal; and an antenna that outputs the transmission signal outputted from the transmission circuit.

10. The communication device according to claim 9, further comprising:

a reception circuit that processes a reception signal received from the antenna; and an antenna duplexer which outputs the transmission signal outputted from the transmission circuit to the antenna, and which outputs the reception signal received from the antenna to the reception circuit.

* * * * *